US011876485B1

(12) United States Patent
Hsieh et al.

(10) Patent No.: US 11,876,485 B1
(45) Date of Patent: Jan. 16, 2024

(54) OSCILLATING DEVICE

(71) Applicant: TXC CORPORATION, Taipei (TW)

(72) Inventors: Wan-Lin Hsieh, Ping Cheng (TW); Sheng-Hsiang Kao, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 17/943,771

(22) Filed: Sep. 13, 2022

(51) Int. Cl.
*H03B 5/04* (2006.01)
*H03B 5/36* (2006.01)

(52) U.S. Cl.
CPC ............... *H03B 5/04* (2013.01); *H03B 5/366* (2013.01)

(58) Field of Classification Search
CPC ........................................................ H03B 5/04
USPC ........................................................ 331/176
See application file for complete search history.

(56) References Cited

U.S. PATENT DOCUMENTS

| 5,986,515 A * | 11/1999 | Sakurai | ................... H03L 1/028 331/177 V |
| 6,166,608 A | 12/2000 | Merriss et al. | |
| 6,621,361 B1 * | 9/2003 | Fry | ........................ H03L 1/04 331/158 |
| 8,653,897 B2 | 2/2014 | Shanfield et al. | |
| 9,257,993 B2 * | 2/2016 | Munaga | ................... H03H 9/08 |

* cited by examiner

*Primary Examiner* — Joseph Chang
(74) *Attorney, Agent, or Firm* — Birch, Stewart, Kolasch & Birch, LLP

(57) ABSTRACT

An oscillating device includes a heater, a thermoelectric cooler, a frequency source, a temperature controlled circuit, and a voltage controlled oscillation circuit. When the ambient temperature is in a low-temperature range, the temperature controlled circuit drives the heater to a target temperature to adjust an operating temperature of the frequency source. When the ambient temperature is in a high-temperature range, the temperature controlled circuit drives the thermoelectric cooler to the target temperature to adjust the operating temperature of the frequency source, and the voltage controlled oscillation circuit drives the frequency source to reduce a frequency variation of the frequency source resulted from the variation of the ambient temperature. Alternatively, the heater or the voltage controlled oscillation circuit may be omitted.

16 Claims, 25 Drawing Sheets

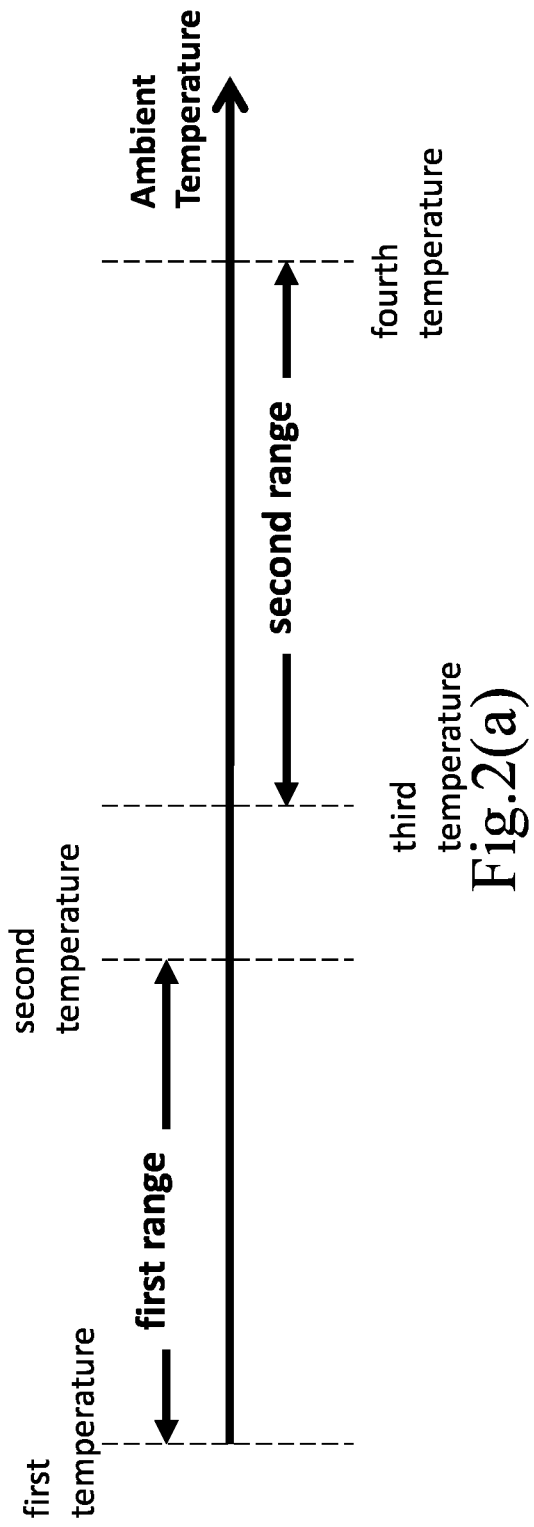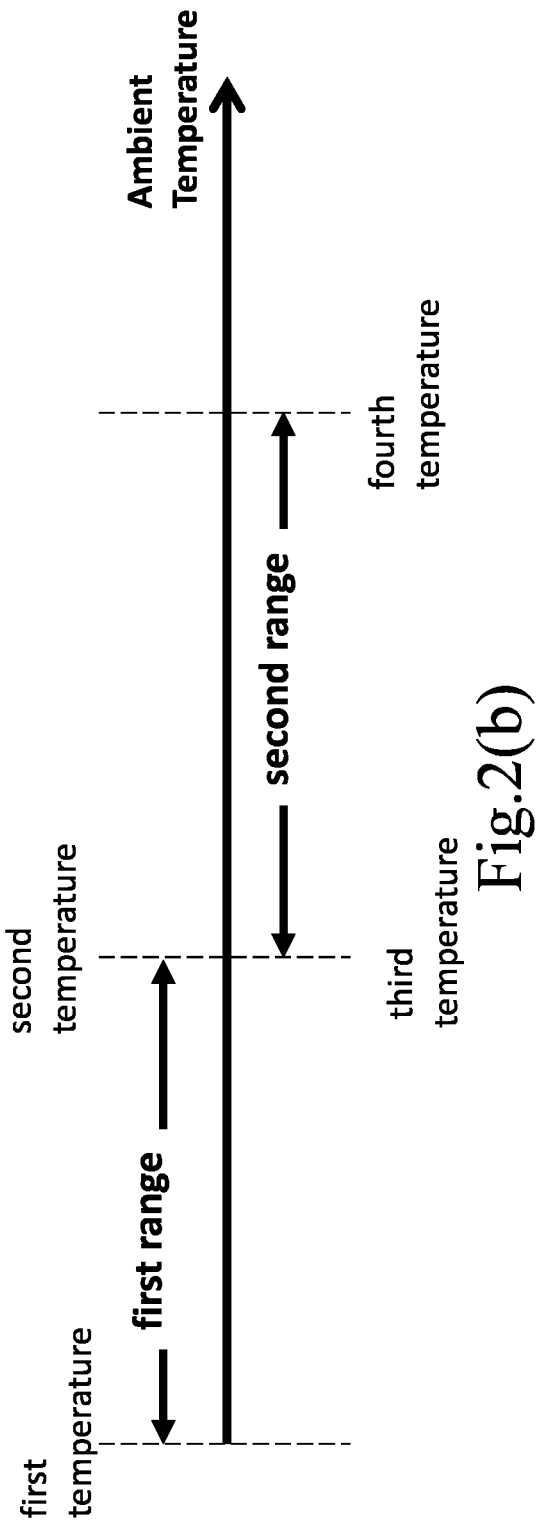

OSCILLATING DEVICE

BACKGROUND OF THE INVENTION

Field of the Invention

The present invention relates to an electronic device, particularly to an oscillating device.

Description of the Related Art

A quartz resonator applied to a crystal oscillator has the property of varying greatly in oscillation frequency characteristics in response to a temperature. Various technologies have been proposed in order to compensate for such variations to ensure highly accurate stable frequency characteristics. A conventionally known oven controlled crystal oscillator is one of such technologies.

This type of the oven controlled crystal oscillator is configured to compare an actual temperature, which is related to an outside air temperature measured with a temperature sensor, with a set temperature, and control a heat source so that a difference between both temperatures is narrowed, thereby keeping the temperature of a quartz resonator housed in a thermostatic oven as a casing at a predetermined target temperature. In detail, the oven controlled crystal oscillator is usually constituted by integrating the temperature sensor; a temperature setting unit where the predetermined target temperature has been set; a comparator; or a control means such as a transistor; a heater as the heat source; and so on with an oscillation circuit for driving the quartz resonator for modularization, and housing the resulting module within the thermostatic oven together with the quartz resonator. The temperature sensor, the temperature setting unit, the comparator, and the heater are integrated in an integrated circuit (IC). When the actual temperature is lower, the set temperature is higher. However, too high a set temperature will degrade the performance of the IC.

To overcome the abovementioned problems, the present invention provides an oscillating device, so as to solve the afore-mentioned problems of the prior art.

SUMMARY OF THE INVENTION

The present invention provides an oscillating device, lest too high a target temperature degrade the performance of an integrated circuit (IC).

In an embodiment of the present invention, an oscillating device, arranged in an environment having an ambient temperature, includes a heater, a thermoelectric cooler, a frequency source, a temperature controlled circuit, and a voltage controlled oscillation circuit. The frequency of the frequency source is temperature-dependent on the ambient temperature. The temperature controlled circuit is electrically connected to the heater and the thermoelectric cooler. When the ambient temperature is in a first range between a first temperature and a second temperature higher than the first temperature, the temperature controlled circuit drives the heater to a target temperature to adjust an operating temperature of the frequency source. When the ambient temperature is in a second range between a third temperature and a fourth temperature higher than the third temperature, the temperature controlled circuit drives the thermoelectric cooler to the target temperature to adjust the operating temperature of the frequency source. The voltage controlled oscillation circuit is electrically connected to the frequency source and the temperature controlled circuit. When the ambient temperature is in the second range, the voltage controlled oscillation circuit drives the frequency source to reduce a frequency variation of the frequency source resulted from a variation of the ambient temperature. The third temperature is higher than the first temperature and the fourth temperature is higher than the second temperature. The temperature controlled circuit is configured to generate a control voltage based on the ambient temperature and the target temperature and transmit the control voltage to the voltage controlled oscillation circuit to drive the frequency source.

In an embodiment of the present invention, the temperature controlled circuit includes at least one temperature sensor, a target temperature setting circuit, a first comparator, and a second comparator. The temperature sensor is electrically connected to the voltage controlled oscillation circuit. The temperature sensor senses the ambient temperature to generate a first detected voltage when the ambient temperature is in the first range. The temperature sensor senses the ambient temperature to generate a second detected voltage and a third detected voltage when the ambient temperature is in the second range. The target temperature setting circuit is electrically connected to the voltage controlled oscillation circuit. The target temperature setting circuit generates a first control voltage based on the ambient temperature and the target temperature when the ambient temperature is in the first range. The target temperature setting circuit generates a second control voltage and a third control voltage based on the ambient temperature and the target temperature when the ambient temperature is in the second range. The first comparator is electrically connected to the at least one temperature sensor, the target temperature setting circuit, and the heater and configured to receive the first control voltage and the first detected voltage and drive the heater based on the first control voltage and the first detected voltage. The second comparator is electrically connected to the temperature sensor, the target temperature setting circuit, and the thermoelectric cooler and configured to receive the second control voltage and the second detected voltage and drive the thermoelectric cooler based on the second control voltage and the second detected voltage. The voltage controlled oscillation circuit is configured to receive the third detected voltage and the third control voltage to drive the frequency source.

In an embodiment of the present invention, the voltage controlled oscillation circuit includes a third comparator, a voltage generator, and at least one voltage controlled variable capacitor. The third comparator is electrically connected to the temperature sensor and the target temperature setting circuit and configured to receive the third control voltage and the third detected voltage to generate a driving voltage. The voltage generator is electrically connected to the third comparator and configured to receive the driving voltage and generate at least one operating voltage based on the driving voltage. The voltage controlled variable capacitor is electrically connected to the frequency source and the voltage generator and configured to receive the at least one operating voltage to adjust capacitance, thereby reducing the frequency variation of the frequency source.

In an embodiment of the present invention, the oscillating device further includes a base with a top thereof provided with a cavity, a wiring substrate, and a cover. The wiring substrate, formed on the base, covers the cavity. The temperature controlled circuit and the voltage controlled oscillation circuit are integrated in an integrated circuit (IC). The IC is formed on the wiring substrate and in the cavity and electrically connected to the wiring substrate through first conductive wires. The first conductive wires are formed in the cavity. The heater is embedded in the wiring substrate or formed on the IC. The frequency source is formed on the wiring substrate. The thermoelectric cooler is formed on the frequency source and electrically connected to the wiring substrate through second conductive wire. The cover, formed on the base, covers the wiring substrate, the frequency source, the thermoelectric cooler, and the second conductive wires.

In an embodiment of the present invention, the oscillating device further includes a wiring substrate, a heat-insulating adhesive, a wiring base with a bottom thereof provided with a cavity, and a cover. The heat-insulating adhesive is formed on the wiring substrate. The temperature controlled circuit and the voltage controlled oscillation circuit are integrated in an integrated circuit (IC). The IC is formed on the wiring base and in the cavity and electrically connected to the wiring base through first conductive wires. The first conductive wires are formed in the cavity. The wiring base is formed on the wiring substrate through the heat-insulating adhesive. The cavity is filled with the heat-insulating adhesive. The heat-insulating adhesive covers the IC and the first conductive wires. The heater is embedded in the wiring base or formed between the heat-insulating adhesive and the IC. The frequency source is formed on the wiring base. The thermoelectric cooler is formed on the frequency source and electrically connected to the wiring base through second conductive wire. The wiring base is electrically connected to the wiring substrate through third conductive wires. The cover, formed on the wiring substrate, covers the wiring base, the frequency source, the thermoelectric cooler, the heat-insulating adhesive, the second conductive wires, and the third conductive wires.

In an embodiment of the present invention, the oscillating device further includes a base with a top thereof provided with a cavity, and a wiring substrate. The wiring substrate, formed on the base, covers the cavity. The temperature controlled circuit and the voltage controlled oscillation circuit are integrated in an integrated circuit (IC). The IC is formed on the wiring substrate and in the cavity and electrically connected to the wiring substrate through first conductive wires. The first conductive wires are formed in the cavity. The heater is embedded in the wiring substrate or formed on the IC. The frequency source is formed on the wiring substrate. The thermoelectric cooler includes a wiring heat-conducting structure, thermoelectric components, and a heat-conducting plate. The wiring heat-conducting structure, formed on the base and electrically connected to the wiring substrate through second conductive wires, covers the wiring substrate, the frequency source, and the second conductive wires. The thermoelectric components are formed on the wiring heat-conducting structure. The heat-conducting plate is formed on the thermoelectric components.

In an embodiment of the present invention, the further includes a wiring substrate, a heat-insulating adhesive, and a wiring base with a bottom thereof provided with a cavity. The heat-insulating adhesive is formed on the wiring substrate. The temperature controlled circuit and the voltage controlled oscillation circuit are integrated in an integrated circuit (IC). The IC is formed on the wiring base and in the cavity and electrically connected to the wiring base through first conductive wires. The first conductive wires are formed in the cavity. The wiring base is formed on the wiring substrate through the heat-insulating adhesive. The cavity is filled with the heat-insulating adhesive. The heat-insulating adhesive covers the IC and the first conductive wires. The heater is embedded in the wiring base or formed between the heat-insulating adhesive and the IC. The frequency source is formed on the wiring base. The thermoelectric cooler includes a wiring heat-conducting structure, thermoelectric components, and a heat-conducting plate. The wiring heat-conducting structure is formed on the wiring substrate and electrically connected to the wiring base through second conductive wires. The wiring base is electrically connected to the wiring substrate through second conductive wires. The wiring heat-conducting structure covers the wiring base, the frequency source, the heat-insulating adhesive, the second conductive wires, and the third conductive wires. The thermoelectric components are formed on the wiring heat-conducting structure. The heat-conducting plate is formed on the thermoelectric components.

In an embodiment of the present invention, the oscillating device further includes a wiring base with a top thereof provided with a cavity, a heat-insulating adhesive, and a wiring substrate. The heat-insulating adhesive is formed on the wiring base and in the cavity. The wiring substrate is formed on the heat-insulating adhesive and in the cavity. The temperature controlled circuit and the voltage controlled oscillation circuit are integrated in an integrated circuit (IC). The IC is formed on a bottom of the wiring substrate and electrically connected to the wiring substrate through first conductive wires. The first conductive wires and the IC are covered with the heat-insulating adhesive. The heater is embedded in the wiring substrate or formed on the IC. The wiring substrate is electrically connected to the wiring base through second conductive wires. The frequency source is formed on the wiring substrate and in the cavity. When the heater is formed on the IC, the heater is covered with the heat-insulating adhesive. The thermoelectric cooler includes a wiring heat-conducting plate, thermoelectric components, and a heat-conducting plate. The wiring heat-conducting plate, formed on the wiring base, covers the cavity. The wiring heat-conducting plate is electrically connected to the wiring base through conductive pads or electrically connected to the wiring substrate through third conductive wires. The thermoelectric components are formed on the wiring heat-conducting plate. The heat-conducting plate is formed on the thermoelectric components.

In an embodiment of the present invention, the oscillating device further includes an outer wiring base with a top provided a first cavity, a heat-insulating adhesive, and an inner wiring base with a bottom thereof provided with a second cavity. The heat-insulating adhesive is formed on the outer wiring base and in the first cavity. The temperature controlled circuit and the voltage controlled oscillation circuit are integrated in an integrated circuit (IC). The IC is formed on the inner wiring base and in the second cavity and electrically connected to the inner wiring base through first conductive wires. The first conductive wires are formed in the second cavity. The inner wiring base is formed on the outer wiring base through the heat-insulating adhesive. The second cavity is filled with the heat-insulating adhesive that covers the IC and the first conductive wires. The heater is embedded in the inner wiring base or formed between the heat-insulating adhesive and the IC. The frequency source is formed on the inner wiring base. The inner wiring base is electrically connected to the outer wiring base through second conductive wires. The thermoelectric cooler includes a wiring heat-conducting plate, thermoelectric components, and a heat-conducting plate. The wiring heat-conducting plate, formed on the outer wiring base, covers the first cavity. The wiring heat-conducting plate is electrically connected to the outer wiring base through conductive pads or electrically connected to the inner wiring base through third conductive wires. The thermoelectric components are formed on the wiring heat-conducting plate. The heat-conducting plate is formed on the thermoelectric components.

In an embodiment of the present invention, the at least one temperature sensor comprises a first temperature sensor and a second temperature sensor. The first temperature sensor is electrically connected to the first comparator and the second comparator. The second temperature sensor is electrically connected to the voltage controlled oscillation circuit. The first temperature sensor senses the ambient temperature to generate the first detected voltage when the ambient temperature is in the first range. The first temperature sensor senses the ambient temperature to generate the second detected voltage when the ambient temperature is in the second range. The second temperature sensor senses the ambient temperature to generate the third detected voltage when the ambient temperature is in the second range.

In an embodiment of the present invention, the target temperature has a correlation of a first-order polynomial, a high-order polynomial, or a set of a first-order and high-order polynomial combination to the ambient temperature.

In an embodiment of the present invention, and oscillating device, arranged in an environment having an ambient temperature, includes a thermoelectric cooler, a frequency source, a voltage controlled oscillation circuit, and a temperature controlled circuit. The voltage controlled oscillation circuit is electrically connected to the frequency source. When the ambient temperature is in a first range between a first temperature and a second temperature higher than the first temperature, the voltage controlled oscillation circuit drives the frequency source to reduce a frequency variation of the frequency source resulted from a variation of the ambient temperature. The temperature controlled circuit is electrically connected to the thermoelectric cooler. When the ambient temperature is in a second range between a third temperature and a fourth temperature higher than the third temperature, the temperature controlled circuit drives the thermoelectric cooler to a target temperature to adjust an operating temperature of the frequency source. The third temperature is higher than the first temperature and the fourth temperature is higher than the second temperature. The temperature controlled circuit is configured to generate a control voltage based on the ambient temperature and the target temperature and transmit the control voltage to the voltage controlled oscillation circuit to drive the frequency source.

In an embodiment of the present invention, the temperature controlled circuit includes at least one temperature sensor, a target temperature setting circuit, and a first comparator. The temperature sensor is electrically connected to the voltage controlled oscillation circuit. The temperature sensor senses the ambient temperature to generate a first detected voltage when the ambient temperature is in the second range. The temperature sensor senses the ambient temperature to generate a second detected voltage when the ambient temperature is in the first range. The target temperature setting circuit is electrically connected to the voltage controlled oscillation circuit. The target temperature setting circuit generates a first control voltage based on the ambient temperature and the target temperature when the ambient temperature is in the second range. The target temperature setting circuit generates a second control voltage based on the ambient temperature and the target temperature when the ambient temperature is in the first range.

The first comparator is electrically connected to the temperature sensor, the target temperature setting circuit, and the thermoelectric cooler and configured to receive the first control voltage and the first detected voltage and drive the thermoelectric cooler based on the first control voltage and the first detected voltage. The voltage controlled oscillation circuit is configured to receive the second detected voltage and the second control voltage to drive the frequency source.

In an embodiment of the present invention, the voltage controlled oscillation circuit includes a second comparator, a voltage generator, and at least one voltage controlled variable capacitor. The second comparator is electrically connected to the temperature sensor and the target temperature setting circuit and configured to receive the second control voltage and the second detected voltage to generate a driving voltage. The voltage generator is electrically connected to the second comparator and configured to receive the driving voltage and generate at least one operating voltage based on the driving voltage. The voltage controlled variable capacitor is electrically connected to the frequency source and the voltage generator and configured to receive the operating voltage to adjust capacitance, thereby reducing the frequency variation of the frequency source.

In an embodiment of the present invention, the at least one temperature sensor includes a first temperature sensor and a second temperature sensor. The first temperature sensor is electrically connected to the first comparator. The second temperature sensor is electrically connected to the voltage controlled oscillation circuit. The first temperature sensor senses the ambient temperature to generate the first detected voltage when the ambient temperature is in the second range. The second temperature sensor senses the ambient temperature to generate the second detected voltage when the ambient temperature is in the first range.

In an embodiment of the present invention, the target temperature has a correlation of a first-order polynomial, a high-order polynomial, or a set of a first-order and high-order polynomial combination to the ambient temperature.

In an embodiment of the present invention, an oscillating device, arranged in an environment having an ambient temperature, includes a heater, a thermoelectric cooler, a frequency source, and a temperature controlled circuit. The frequency of the frequency source is temperature-dependent on the ambient temperature. The temperature controlled circuit is electrically connected to the heater and the thermoelectric cooler. When the ambient temperature is in a first range between a first temperature and a second temperature higher than the first temperature, the temperature controlled circuit drives the heater to a target temperature to adjust an operating temperature of the frequency source. When the ambient temperature is in a second range between a third temperature and a fourth temperature higher than the third temperature, the temperature controlled circuit drives the thermoelectric cooler to the target temperature to adjust the operating temperature of the frequency source. The third temperature is higher than the first temperature and the fourth temperature is higher than the second temperature.

In an embodiment of the present invention, the temperature controlled circuit includes a temperature sensor, a target temperature setting circuit, a first comparator, and a second comparator. The temperature sensor senses the ambient temperature to generate a first detected voltage when the ambient temperature is in the first range. The temperature sensor senses the ambient temperature to generate a second detected voltage when the ambient temperature is in the second range. The target temperature setting circuit generates a first control voltage based on the ambient temperature and the target temperature when the ambient temperature is in the first range. The target temperature setting circuit generates a second control voltage based on the ambient temperature and the target temperature when the ambient temperature is in the second range. The first comparator is electrically connected to the temperature sensor, the target temperature setting circuit, and the heater and configured to receive the first control voltage and the first detected voltage and drive the heater based on the first control voltage and the first detected voltage. The second comparator is electrically connected to the temperature sensor, the target temperature setting circuit, and the thermoelectric cooler and configured to receive the second control voltage and the second detected voltage and drive the thermoelectric cooler based on the second control voltage and the second detected voltage.

In an embodiment of the present invention, the target temperature has a correlation of a first-order polynomial, a high-order polynomial, or a set of a first-order and high-order polynomial combination to the ambient temperature.

To sum up, the voltage controlled oscillation circuit drives a frequency source to reduce the frequency variation of the frequency source resulted from the variation of the ambient temperature or drives the thermoelectric cooler when the ambient temperature is higher, lest too high a target temperature degrade the performance of an integrated circuit (IC).

BRIEF DESCRIPTION OF THE DRAWINGS

FIGS. 2(a)-2(c) are diagrams schematically illustrating the distribution of a first temperature, a second temperature, a third temperature, and a fourth temperature according to various embodiments of the invention;

DETAILED DESCRIPTION OF THE INVENTION

Figure 1:
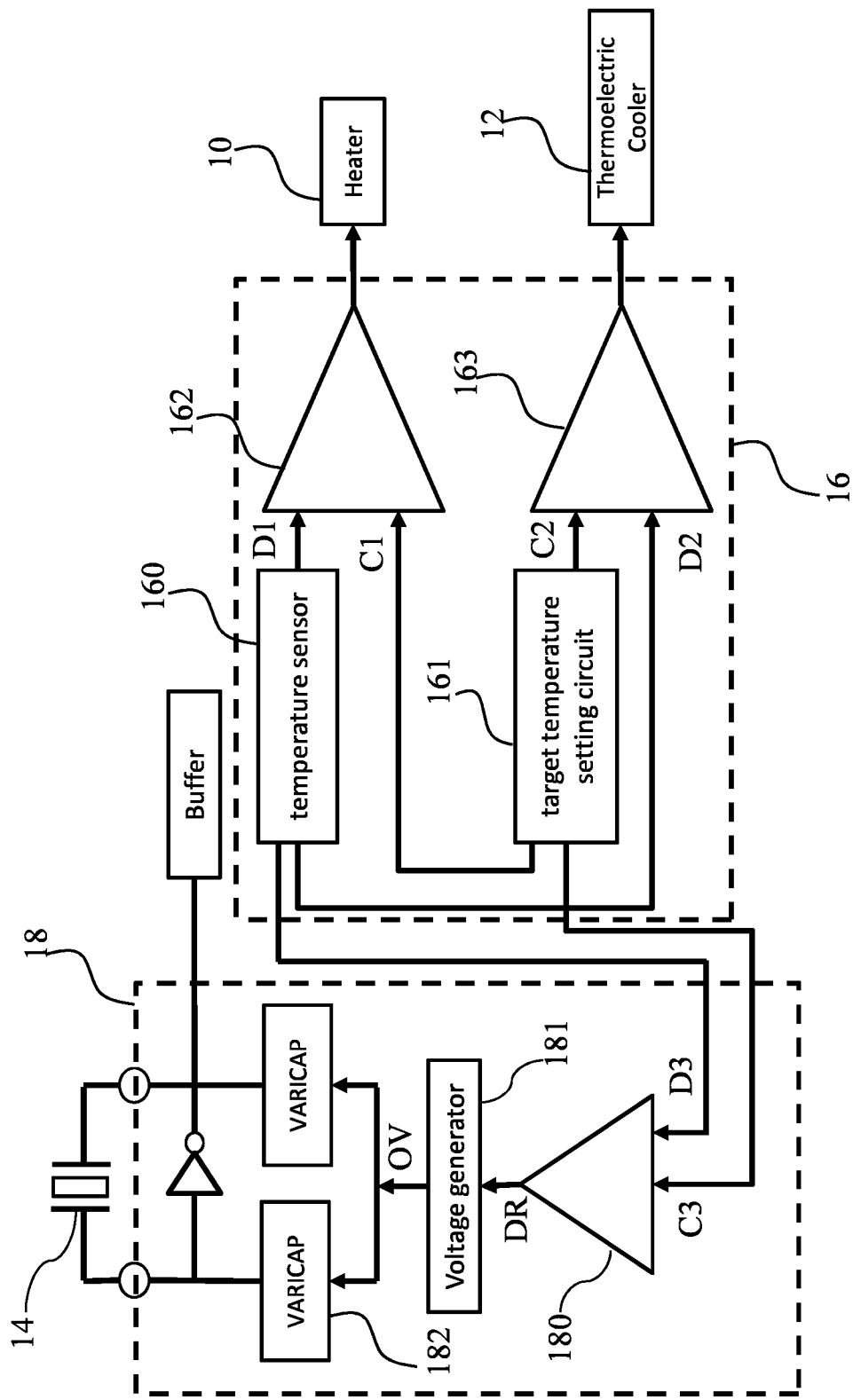
FIG. 1 is a diagram schematically illustrating an oscillating device according to a first embodiment of the invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

In the following description, an oscillating device will be provided. In an oscillating device, a voltage controlled oscillation circuit drives a frequency source to reduce a frequency variation of the frequency source resulted from a variation of the ambient temperature or a thermoelectric cooler is driven when the ambient temperature is higher, lest too high a target temperature degrade the performance of an integrated circuit (IC).

Figure 2C:
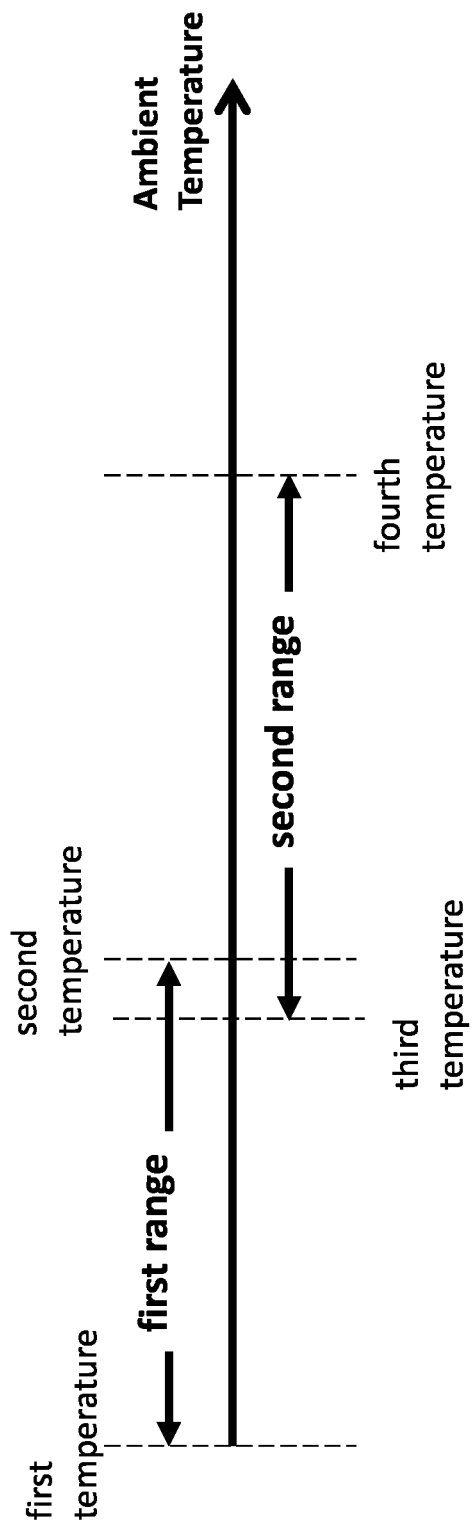

FIG. 1 is a diagram schematically illustrating an oscillating device according to a first embodiment of the invention. FIGS. 2(a)-2(c) are diagrams schematically illustrating the distribution of a first temperature, a second temperature, a third temperature, and a fourth temperature according to various embodiments of the invention. Referring to FIG. 1 and FIGS. 2(a)-2(c), the first embodiment is introduced as follows. The oscillating device, arranged in an environment having an ambient temperature, includes a heater 10, a thermoelectric cooler 12, a frequency source 14, a temperature controlled circuit 16, and a voltage controlled oscillation circuit 18. The frequency source 14 may be implemented with a crystal resonator, but the present invention is not limited thereto. The frequency of the frequency source 14 is temperature-dependent on the ambient temperature. The temperature controlled circuit 16 is electrically connected to the heater 10 and the thermoelectric cooler 12. The voltage controlled oscillation circuit 18 is electrically connected to the frequency source 14 and the temperature controlled circuit 16.

The operation of the first embodiment is introduced as follows. When the ambient temperature is in a first range between a first temperature and a second temperature higher than the first temperature, the temperature controlled circuit 16 drives the heater 10 to a target temperature to adjust the operating temperature of the frequency source 14. In some embodiments, the target temperature may have a correlation of a first-order polynomial, a high-order polynomial, or a set of a first-order and high-order polynomial combination to the ambient temperature. When the ambient temperature is in a second range between a third temperature and a fourth temperature higher than the third temperature, the temperature controlled circuit 16 drives the thermoelectric cooler 12 to the target temperature to adjust the operating temperature of the frequency source 14, and the voltage controlled oscillation circuit 18 drives the frequency source 14 to reduce the frequency variation of the frequency source 14 resulted from the variation of the ambient temperature, lest too high a target temperature degrade the performance of the temperature controlled circuit 16 and the voltage controlled oscillation circuit 18 that can be integrated into an integrated circuit. It is noted that the temperature controlled circuit 16 generates a control voltage based on the ambient temperature and the target temperature and transmit the control voltage to the voltage controlled oscillation circuit 18 to drive the frequency source 14. In addition, the third temperature is higher than the first temperature and the fourth temperature is higher than the second temperature. As illustrated in FIG. 2(a), the third temperature may be higher than the second temperature. As illustrated in FIG. 2(b), the third temperature may be equal to the second temperature. As illustrated in FIG. 2(c), the second temperature may be higher than the third temperature. FIGS. 2(a)-2(c) are also applied to the following embodiments.

In some embodiments, the temperature controlled circuit 16 may include at least one temperature sensor 160, a target temperature setting circuit 161, a first comparator 162, and a second comparator 163. The temperature sensor 160 is electrically connected to the voltage controlled oscillation circuit 18. The target temperature setting circuit 161 is electrically connected to the voltage controlled oscillation circuit 18. The first comparator 162 is electrically connected to the temperature sensor 160, the target temperature setting circuit 161, and the heater 10. The second comparator 163 is electrically connected to the temperature sensor 160, the target temperature setting circuit 161, and the thermoelectric cooler 12.

The temperature sensor 160 senses the ambient temperature to generate a first detected voltage D1 when the ambient temperature is in the first range. The temperature sensor 160 senses the ambient temperature to generate a second detected voltage D2 and a third detected voltage D3 when the ambient temperature is in the second range. The target temperature setting circuit 161 generates a first control voltage C1 based on the ambient temperature and the target temperature when the ambient temperature is in the first range. The target temperature setting circuit 161 generates a second control voltage C2 and a third control voltage C3 based on the ambient temperature and the target temperature when the ambient temperature is in the second range. The first comparator 162 receives the first control voltage C1 and the first detected voltage D1 and drives the heater 10 based on the first control voltage C1 and the first detected voltage D1. The second comparator 163 receives the second control voltage C2 and the second detected voltage D2 and drives the thermoelectric cooler 12 based on the second control voltage C2 and the second detected voltage D2. The voltage controlled oscillation circuit 18 receives the third detected voltage D3 and the third control voltage C3 to drive the frequency source 14.

The voltage controlled oscillation circuit 18 may include a third comparator 180, a voltage generator 181, and at least one voltage controlled variable capacitor 182. The first embodiment exemplifies two voltage controlled variable capacitors 182. The third comparator 180 is electrically connected to the temperature sensor 160 and the target temperature setting circuit 161. The voltage generator 181 is electrically connected to the third comparator 180. The voltage controlled variable capacitors 182 are electrically connected to the frequency source 14 and the voltage generator 181. The third comparator 180 receives the third control voltage C3 and the third detected voltage D3 to generate a driving voltage DR. The voltage generator 181 receives the driving voltage DR and generates at least one operating voltage OV based on the driving voltage DR. The voltage controlled variable capacitors 182 receive the operating voltage OV to adjust capacitance, thereby reducing the frequency variation of the frequency source 14.

Figure 3:
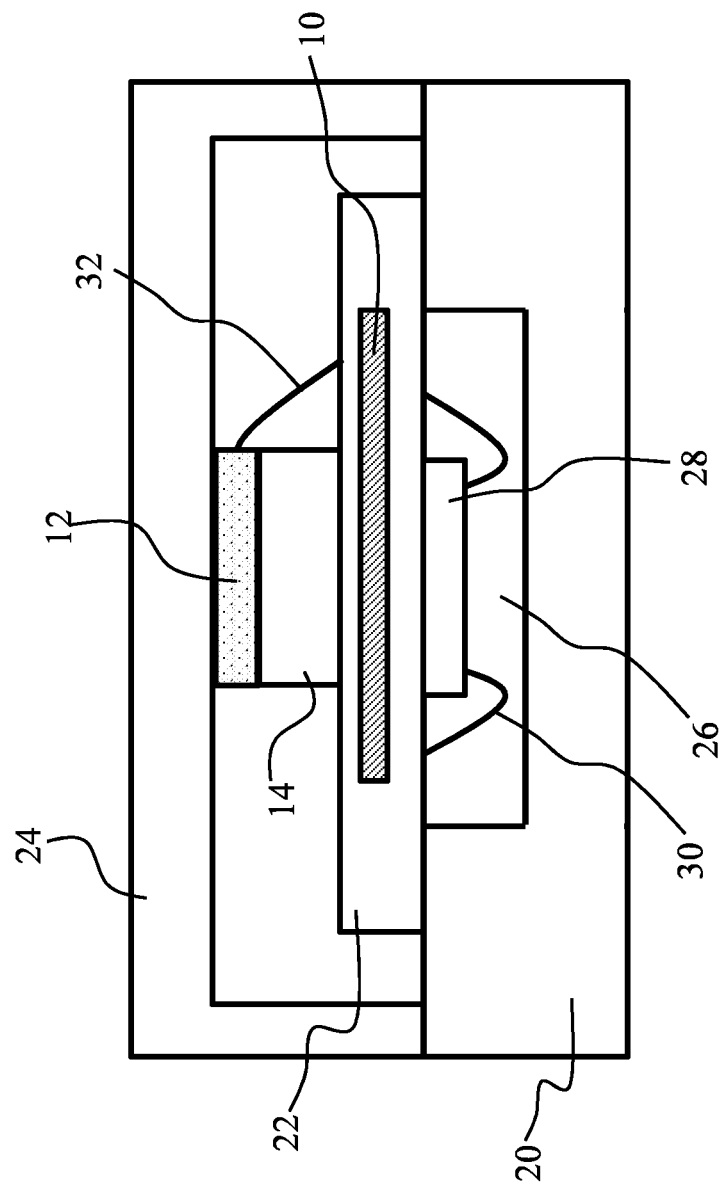
FIG. 3 is a cross-sectional view of an oscillating device according to a second embodiment of the invention.

FIG. 3 is a cross-sectional view of an oscillating device according to a second embodiment of the invention. Referring to FIG. 3 and FIG. 1, the second embodiment is introduced as follows. Compared with the first embodiment, the second embodiment of the oscillating device further includes a base 20, a wiring substrate 22, and a cover 24. The top of the base 20 is provided with a cavity 26. The wiring substrate 22, formed on the base 20, covers the cavity 26.

The temperature controlled circuit 16 and the voltage controlled oscillation circuit 18 are integrated in an integrated circuit (IC) 28. The IC 28 is formed on the wiring substrate 22 and in the cavity 26 and electrically connected to the wiring substrate 22 through first conductive wires 30. The first conductive wires 30 are formed in the cavity 26. The heater 10 is embedded in the wiring substrate 22. The frequency source 14 is formed on the wiring substrate 22. The thermoelectric cooler 12 is formed on the frequency source 14 and electrically connected to the wiring substrate 22 through second conductive wire 32. The cover 24, formed on the base 20, covers the wiring substrate 22, the frequency source 14, the thermoelectric cooler 12, and the second conductive wires 32.

Figure 4:
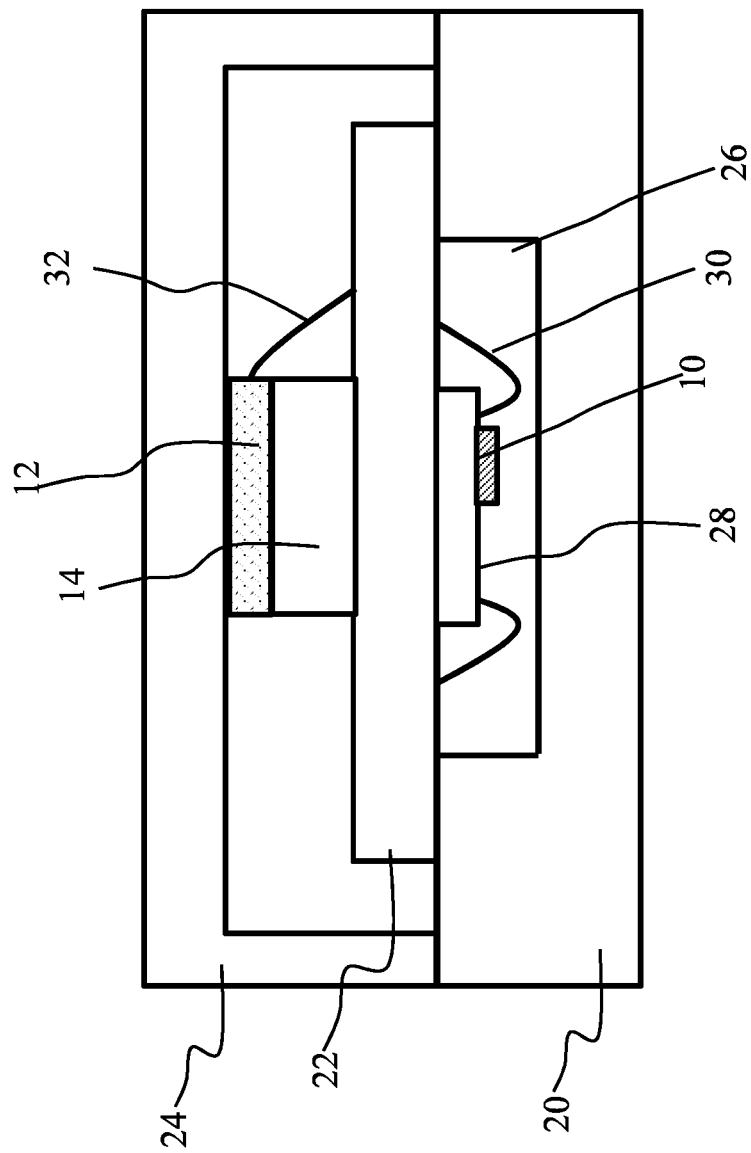
FIG. 4 is a cross-sectional view of an oscillating device according to a third embodiment of the invention.

FIG. 4 is a cross-sectional view of an oscillating device according to a third embodiment of the invention. Referring to FIG. 4, the third embodiment is introduced as follows. The third embodiment is different from the second embodiment in the location of the heater 10. In the third embodiment, the heater 10 is formed on the IC 28. The other structures have been described previously in the second embodiment so will not be reiterated.

Figure 5:
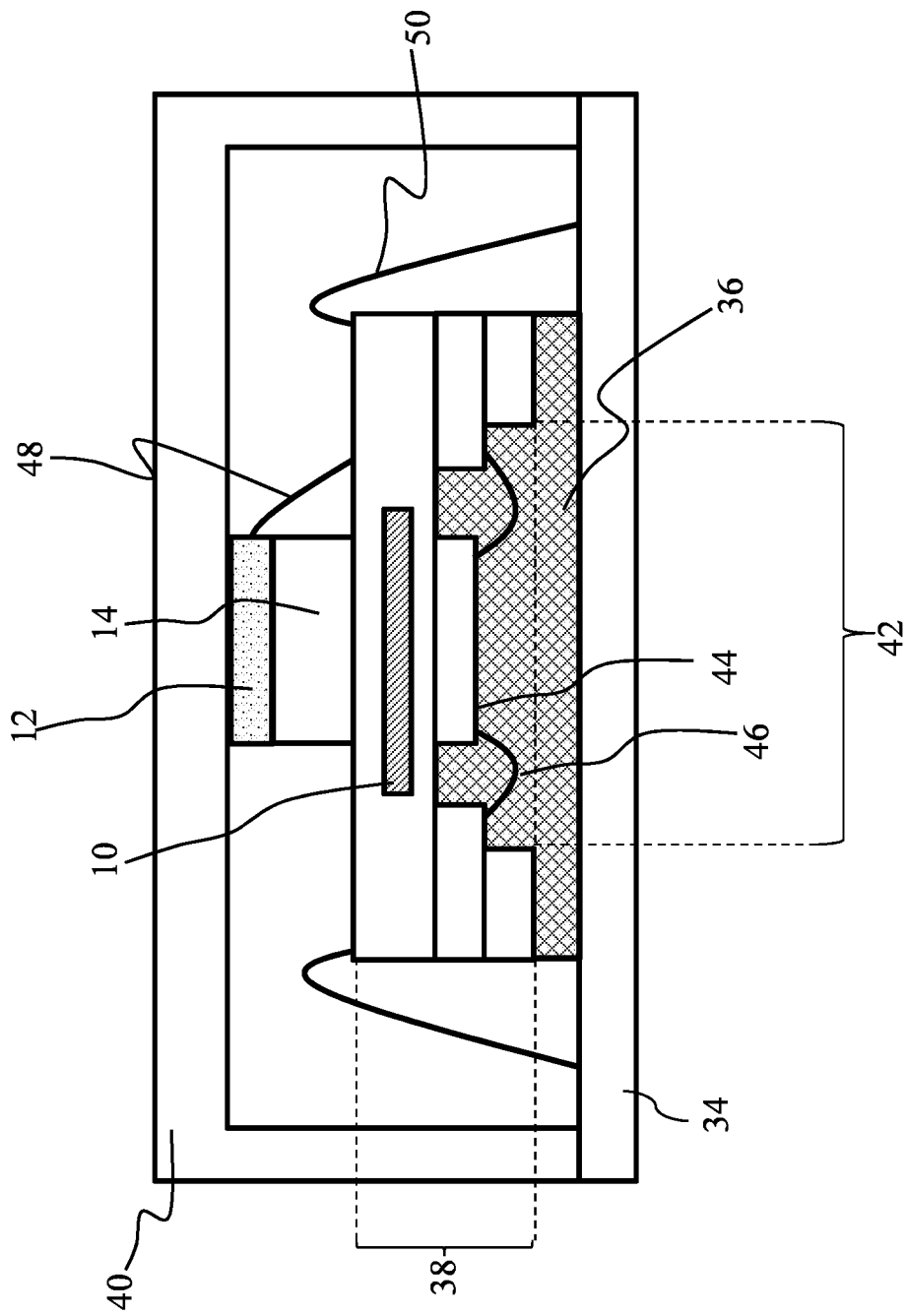
FIG. 5 is a cross-sectional view of an oscillating device according to a fourth embodiment of the invention.

FIG. 5 is a cross-sectional view of an oscillating device according to a fourth embodiment of the invention. Referring to FIG. 5 and FIG. 1, the fourth embodiment is introduced as follows. Compared with the first embodiment, the fourth embodiment of the oscillating device further includes a wiring substrate 34, a heat-insulating adhesive 36, a wiring base 38, and a cover 40. The heat-insulating adhesive 36 is formed on the wiring base 38. The bottom of the wiring base 38 is provided with a cavity 42. The temperature controlled circuit 16 and the voltage controlled oscillation circuit 18 are integrated in an integrated circuit (IC) 44. The IC 44 is formed on the wiring base 38 and in the cavity 42 and electrically connected to the wiring base 38 through first conductive wires 46. The first conductive wires 46 are formed in the cavity 42. The wiring base 38 is formed on the wiring substrate 34 through the heat-insulating adhesive 36. The cavity 42 is filled with the heat-insulating adhesive 36. The heat-insulating adhesive 36 covers the IC 44 and the first conductive wires 46. The heater 10 is embedded in the wiring base 38. The frequency source 14 is formed on the wiring base 38. The thermoelectric cooler 12 is formed on the frequency source 14 and electrically connected to the wiring base 38 through second conductive wire 48. The wiring base 38 is electrically connected to the wiring substrate 34 through third conductive wires 50. The cover 40, formed on the wiring substrate 34, covers the wiring base 38, the frequency source 14, the thermoelectric cooler 12, the heat-insulating adhesive 36, the second conductive wires 48, and the third conductive wires 50.

Figure 6:
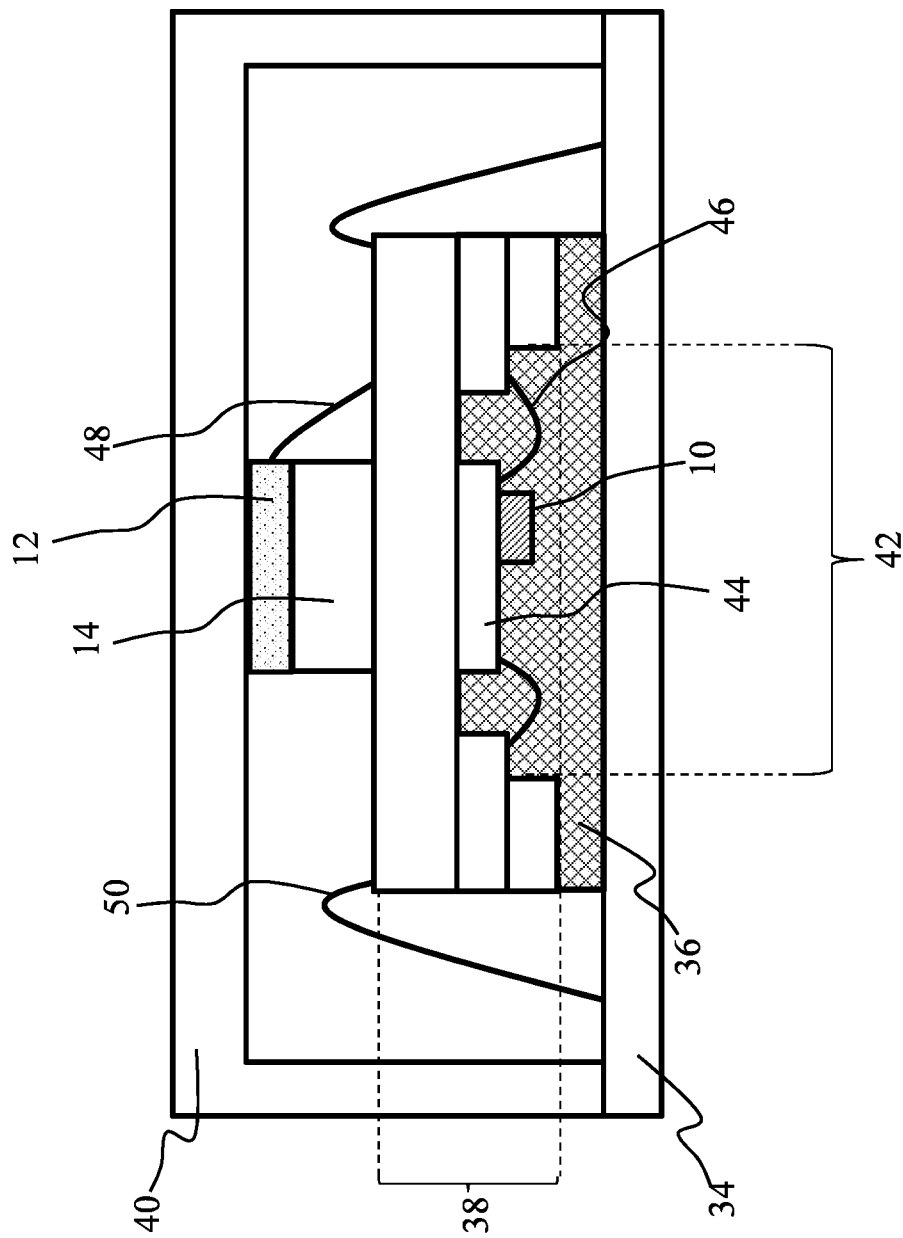
FIG. 6 is a cross-sectional view of an oscillating device according to a fifth embodiment of the invention.

FIG. 6 is a cross-sectional view of an oscillating device according to a fifth embodiment of the invention. Referring to FIG. 6, the fifth embodiment is introduced as follows. The fifth embodiment is different from the fourth embodiment in the location of the heater 10. In the fifth embodiment, the heater 10 is formed between the heat-insulating adhesive 36 and the IC 44. The other structures have been described previously in the fourth embodiment so will not be reiterated.

Figure 7:
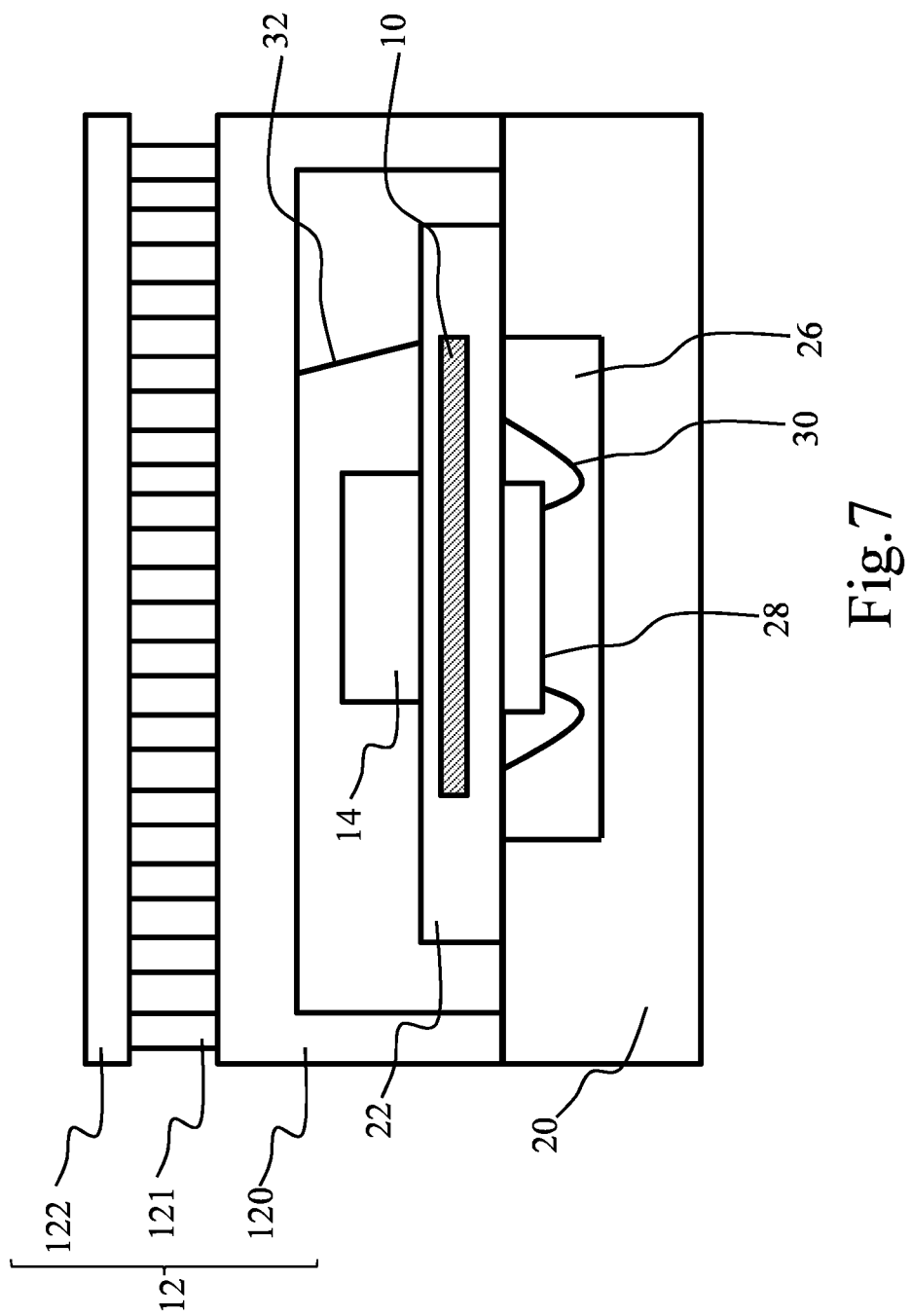
FIG. 7 is a cross-sectional view of an oscillating device according to a sixth embodiment of the invention.

FIG. 7 is a cross-sectional view of an oscillating device according to a sixth embodiment of the invention. Referring to FIG. 7 and FIG. 1, the sixth embodiment is introduced as follows. Compared with the first embodiment, the sixth embodiment of the oscillating device further includes a base 20 and a wiring substrate 22. The top of the base 20 is provided with a cavity 26. The wiring substrate 22, formed on the base 20, covers the cavity 26. The temperature controlled circuit 16 and the voltage controlled oscillation circuit 18 are integrated in an integrated circuit (IC) 28. The IC 28 is formed on the wiring substrate 22 and in the cavity 26 and electrically connected to the wiring substrate 22 through first conductive wires 30. The first conductive wires 30 are formed in the cavity 26. The heater 10 is embedded in the wiring substrate 22. The frequency source 14 is formed on the wiring substrate 22. In an embodiment, the thermoelectric cooler 12 may include a wiring heat-conducting structure 120, thermoelectric components 121, and a heat-conducting plate 122. The wiring heat-conducting structure 120 and the thermoelectric component 121 may be respectively implemented with a wiring ceramic structure and a thermoelectric coupler, but the present invention is not limited thereto. The wiring heat-conducting structure 120, formed on the base 20 and electrically connected to the wiring substrate 22 through second conductive wires 32, covers the wiring substrate 22, the frequency source 14, and the second conductive wires 32. The thermoelectric components 121 are formed on the wiring heat-conducting structure 120. The heat-conducting plate 122 is formed on the thermoelectric components 121.

Figure 8:
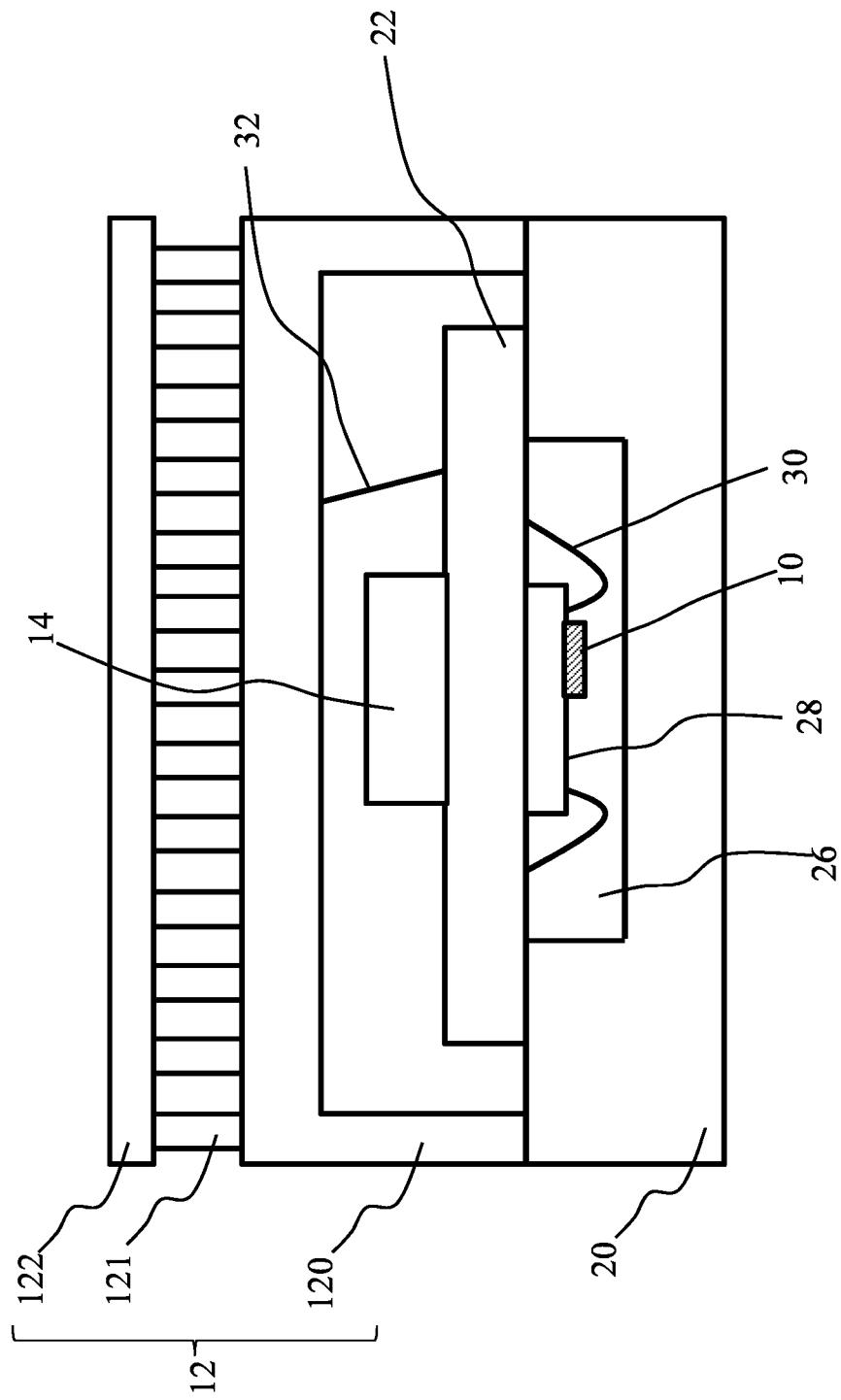
FIG. 8 is a cross-sectional view of an oscillating device according to a seventh embodiment of the invention.

FIG. 8 is a cross-sectional view of an oscillating device according to a seventh embodiment of the invention. Referring to FIG. 8, the seventh embodiment is introduced as follows. The seventh embodiment is different from the sixth embodiment in the location of the heater 10. In the seventh embodiment, the heater 10 is formed on the IC 28. The other structures have been described previously in the sixth embodiment so will not be reiterated.

Figure 9:
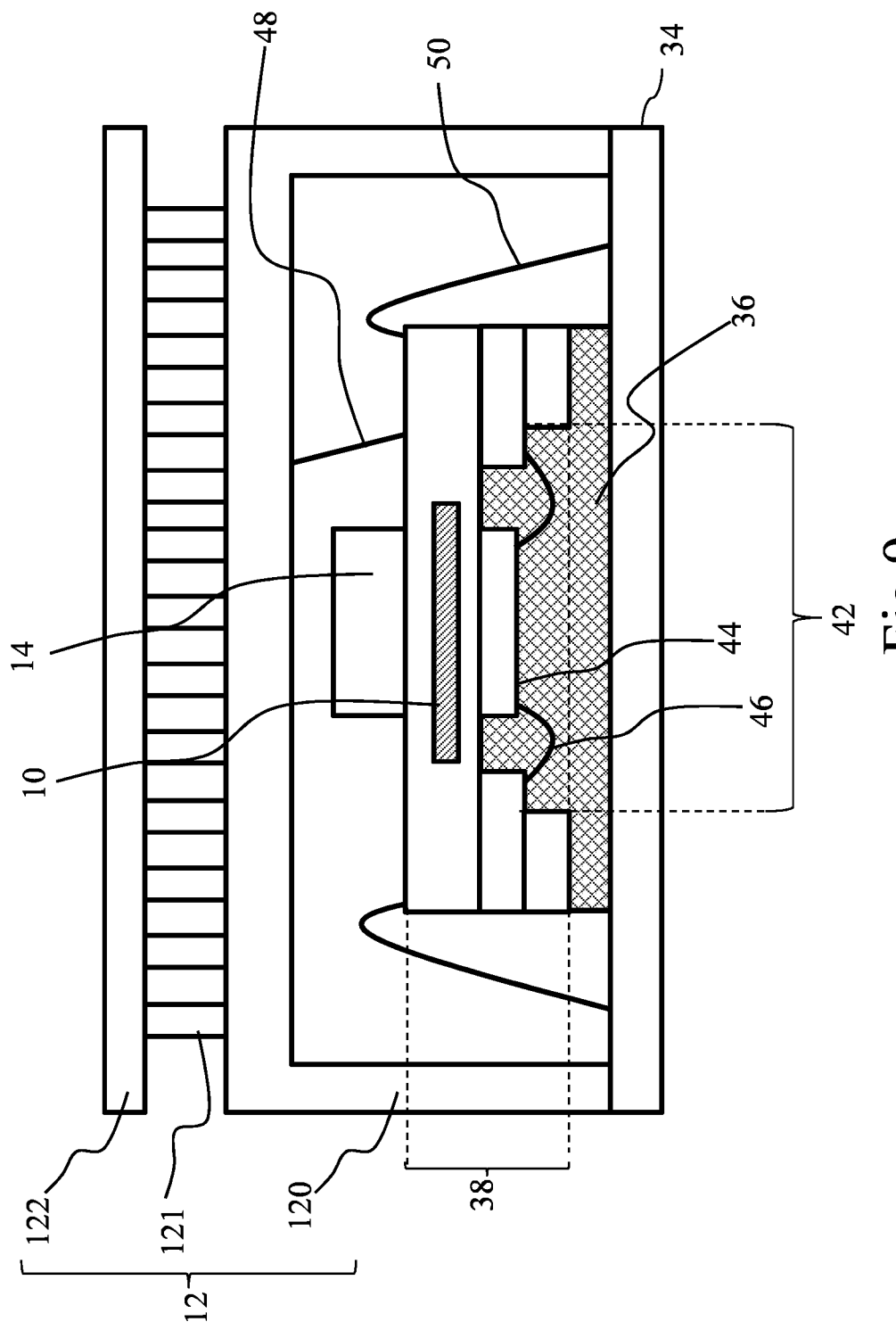
FIG. 9 is a cross-sectional view of an oscillating device according to an eighth embodiment of the invention.

FIG. 9 is a cross-sectional view of an oscillating device according to an eighth embodiment of the invention. Referring to FIG. 9 and FIG. 1, the eighth embodiment is introduced as follows. Compared with the first embodiment, the eighth embodiment of the oscillating device further includes a wiring substrate 34, a heat-insulating adhesive 36, and a wiring base 38. The heat-insulating adhesive 36 is formed on the wiring substrate 34. The bottom of the wiring base 38 is provided with a cavity 42. The temperature controlled circuit 16 and the voltage controlled oscillation circuit 18 are integrated in an integrated circuit (IC) 44. The IC 44 is formed on the wiring base 38 and in the cavity 42 and electrically connected to the wiring base 38 through first conductive wires 46. The first conductive wires 46 are formed in the cavity 42. The wiring base 38 is formed on the wiring substrate 34 through the heat-insulating adhesive 36. The cavity 42 is filled with the heat-insulating adhesive 36. The heat-insulating adhesive 36 covers the IC 44 and the first conductive wires 46. The heater 10 is embedded in the wiring base 38. The frequency source 14 is formed on the wiring base 38. In an embodiment, the thermoelectric cooler 12 may include a wiring heat-conducting structure 120, thermoelectric components 121, and a heat-conducting plate 122. The wiring heat-conducting structure 120 and the thermoelectric component 121 may be respectively implemented with a wiring ceramic structure and a thermoelectric coupler, but the present invention is not limited thereto. The wiring heat-conducting structure 120 is formed on the wiring substrate 34 and electrically connected to the wiring base 38 through second conductive wires 48. The wiring base 38 is electrically connected to the wiring substrate 34 through third conductive wires 50. The wiring heat-conducting structure 120 covers the wiring base 38, the frequency source 14, the heat-insulating adhesive 36, the second conductive wires 48, and the third conductive wires 50. The thermoelectric components 121 are formed on the wiring heat-conducting structure 120. The heat-conducting plate 122 is formed on the thermoelectric components 121.

Figure 10:
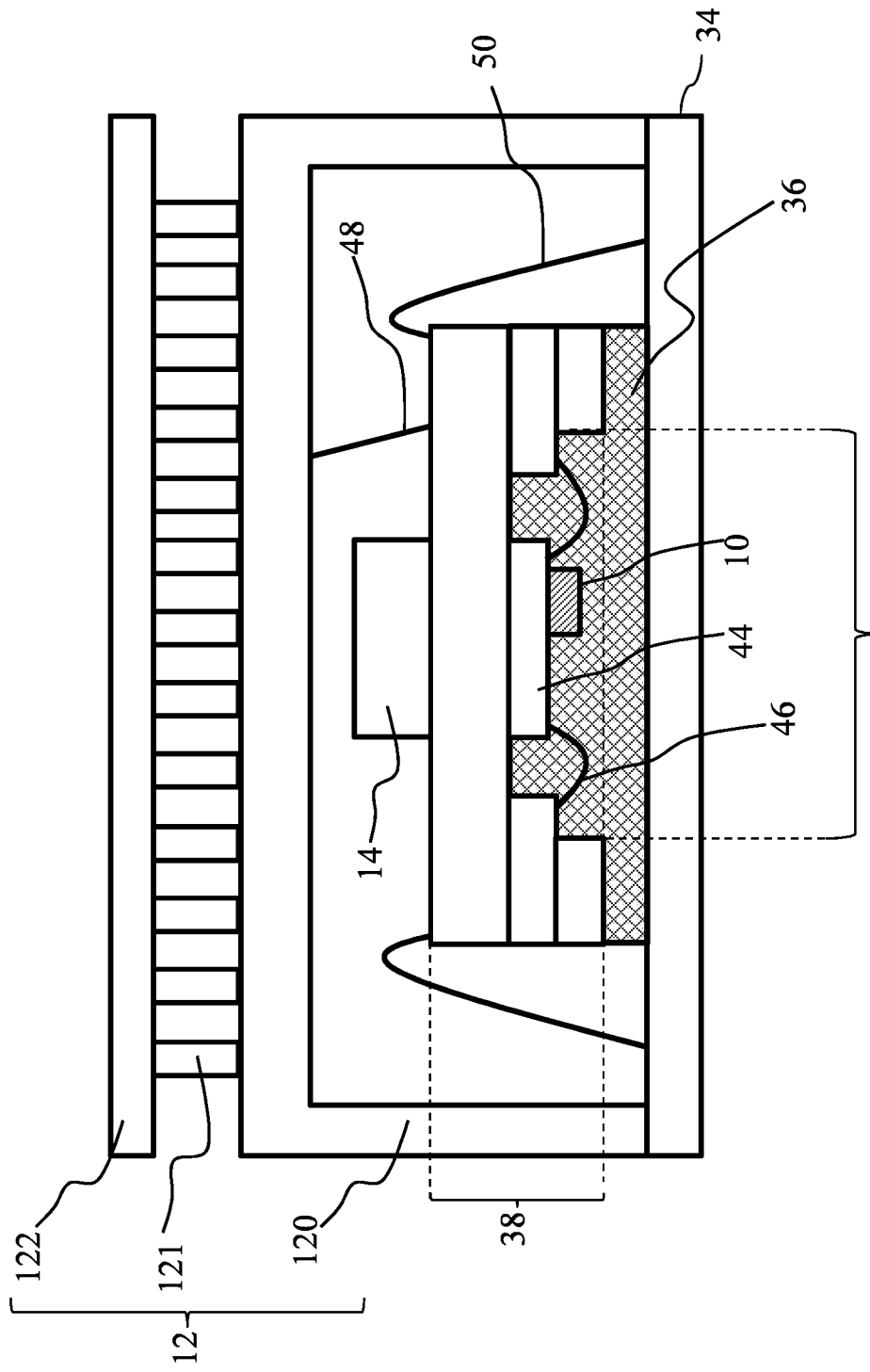
FIG. 10 is a cross-sectional view of an oscillating device according to a ninth embodiment of the invention.

FIG. 10 is a cross-sectional view of an oscillating device according to a ninth embodiment of the invention. Referring to FIG. 10, the ninth embodiment is introduced as follows. The ninth embodiment is different from the eighth embodiment in the location of the heater 10. In the ninth embodiment, the heater 10 is formed between the heat-insulating adhesive 36 and the IC 44. The other structures have been described previously in the eighth embodiment so will not be reiterated.

Figure 11:
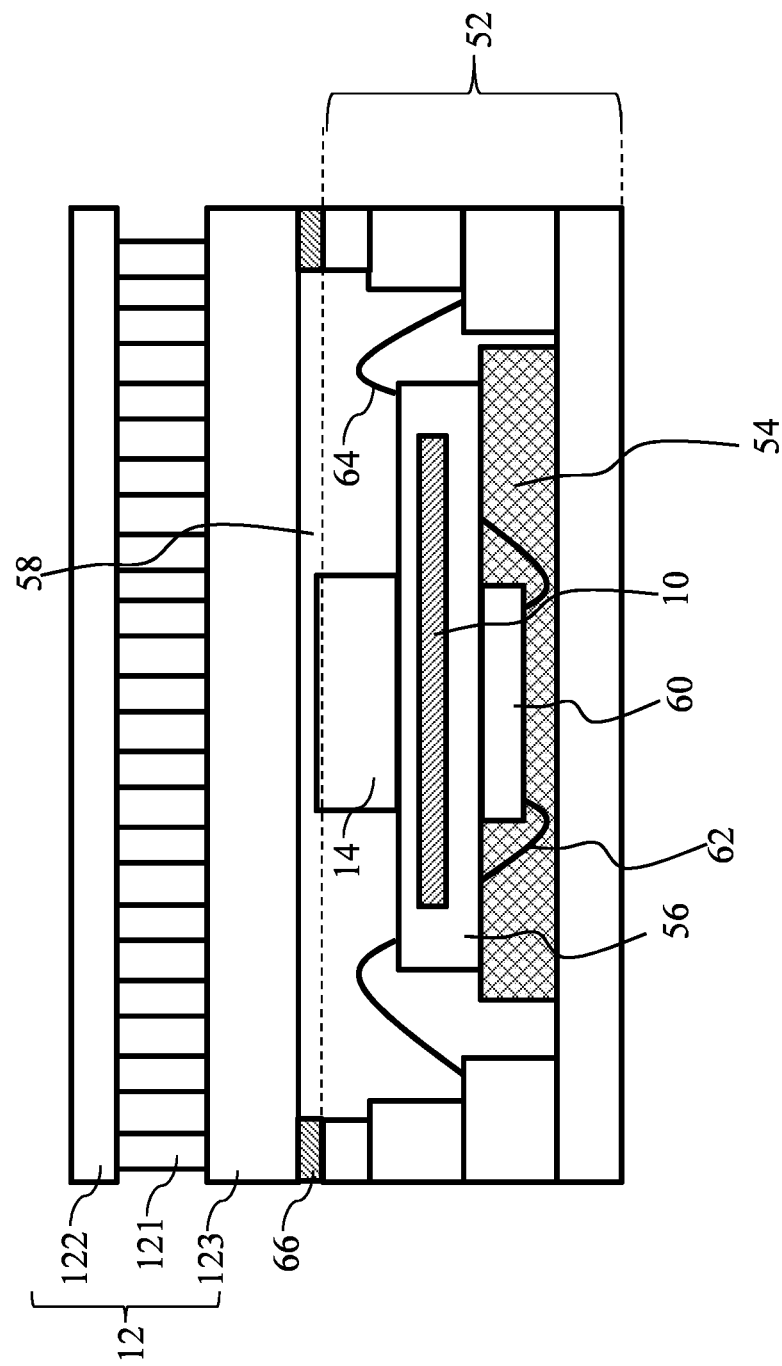
FIG. 11 is a cross-sectional view of an oscillating device according to a tenth embodiment of the invention.

FIG. 11 is a cross-sectional view of an oscillating device according to a tenth embodiment of the invention. Referring to FIG. 11 and FIG. 1, the tenth embodiment is introduced as follows. Compared with the first embodiment, the tenth embodiment of the oscillating device further includes a wiring base 52, a heat-insulating adhesive 54, and a wiring substrate 56. The top of the wiring base 52 is provided with a cavity 58. The heat-insulating adhesive 54 is formed on the wiring base 52 and in the cavity 58. The wiring substrate 56 is formed on the heat-insulating adhesive 54 and in the cavity 58. The temperature controlled circuit 16 and the voltage controlled oscillation circuit 18 are integrated in an integrated circuit (IC) 60. The IC 60 is formed on the bottom of the wiring substrate 56 and electrically connected to the wiring substrate 56 through first conductive wires 62. The first conductive wires 62 and the IC 60 are covered with the heat-insulating adhesive 54. The heater 10 is embedded in the wiring substrate 56. The wiring substrate 56 is electrically connected to the wiring base 52 through second conductive wires 64. The frequency source 14 is formed on the wiring substrate 56 and in the cavity 58. In an embodiment, the thermoelectric cooler 12 may include a wiring heat-conducting plate 123, thermoelectric components 121, and a heat-conducting plate 122. The thermoelectric components 121 may be thermoelectric couplers. The wiring heat-conducting plate 123, formed on the wiring base 52 and electrically connected to the wiring base 52 through conductive pads 66, covers the cavity 58. The thermoelectric components 121 are formed on the wiring heat-conducting plate 123. The heat-conducting plate 122 is formed on the thermoelectric components 121.

Figure 12:
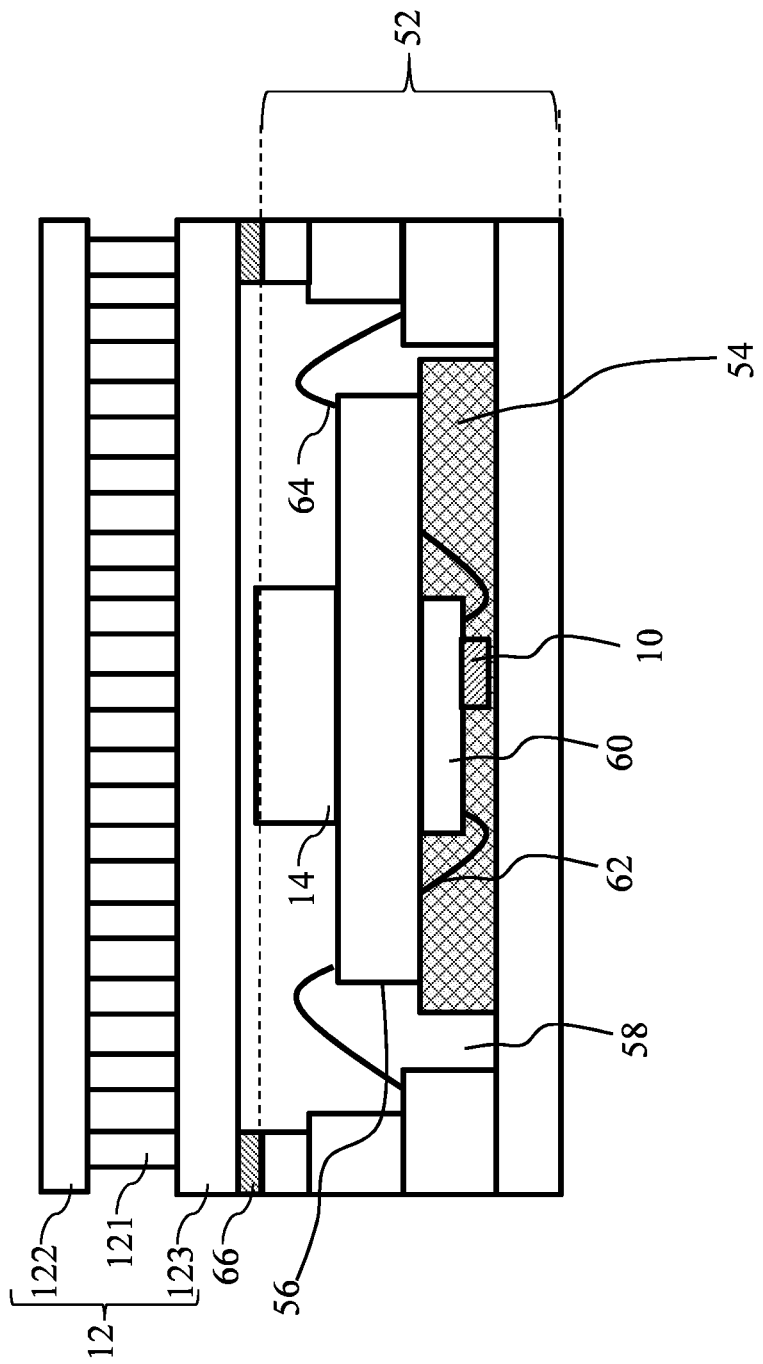
FIG. 12 is a cross-sectional view of an oscillating device according to an eleventh embodiment of the invention.

FIG. 12 is a cross-sectional view of an oscillating device according to an eleventh embodiment of the invention. Referring to FIG. 12, the eleventh embodiment is introduced as follows. The eleventh embodiment is different from the tenth embodiment in the location of the heater 10. In the eleventh embodiment, the heater 10 is formed on the IC 60 and covered by the heat-insulating adhesive 54. The other structures have been described previously in the tenth embodiment so will not be reiterated.

Figure 13:
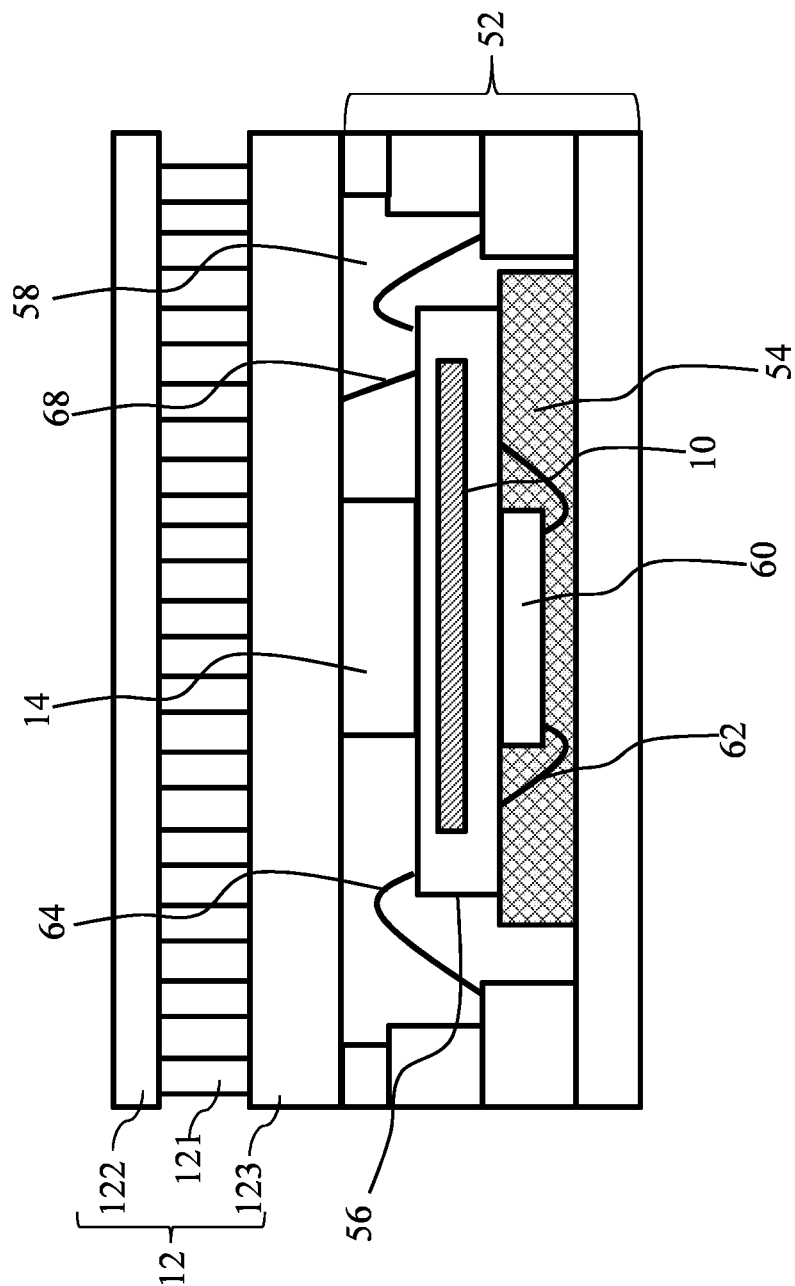
FIG. 13 is a cross-sectional view of an oscillating device according to a twelfth embodiment of the invention.

FIG. 13 is a cross-sectional view of an oscillating device according to a twelfth embodiment of the invention. Referring to FIG. 13, the twelfth embodiment is introduced as follows. The twelfth embodiment is different from the tenth embodiment in the manner that the wiring heat-conducting plate 123 is electrically connected. In the twelfth embodiment, the wiring heat-conducting plate 123 is electrically connected to the wiring substrate 56 through third conductive wires 68 rather than connected to the wiring base 52. The other structures have been described previously in the tenth embodiment so will not be reiterated.

Figure 14:
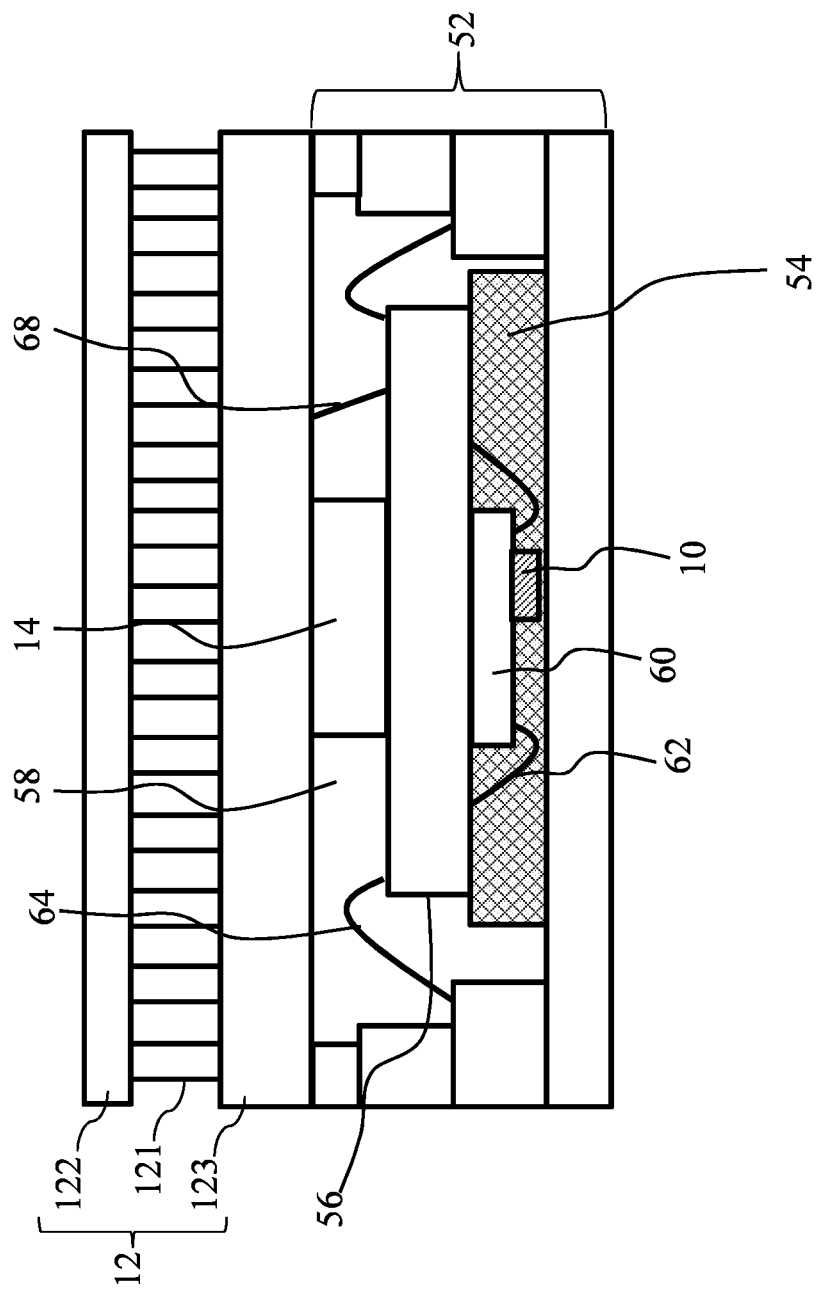
FIG. 14 is a cross-sectional view of an oscillating device according to a thirteenth embodiment of the invention.

FIG. 14 is a cross-sectional view of an oscillating device according to a thirteenth embodiment of the invention. Referring to FIG. 14, the thirteenth embodiment is introduced as follows. The thirteenth embodiment is different from the twelfth embodiment in the location of the heater 10. In the thirteenth embodiment, the heater 10 is formed on the IC 60 and covered by the heat-insulating adhesive 54. The other structures have been described previously in the twelfth embodiment so will not be reiterated.

Figure 15:
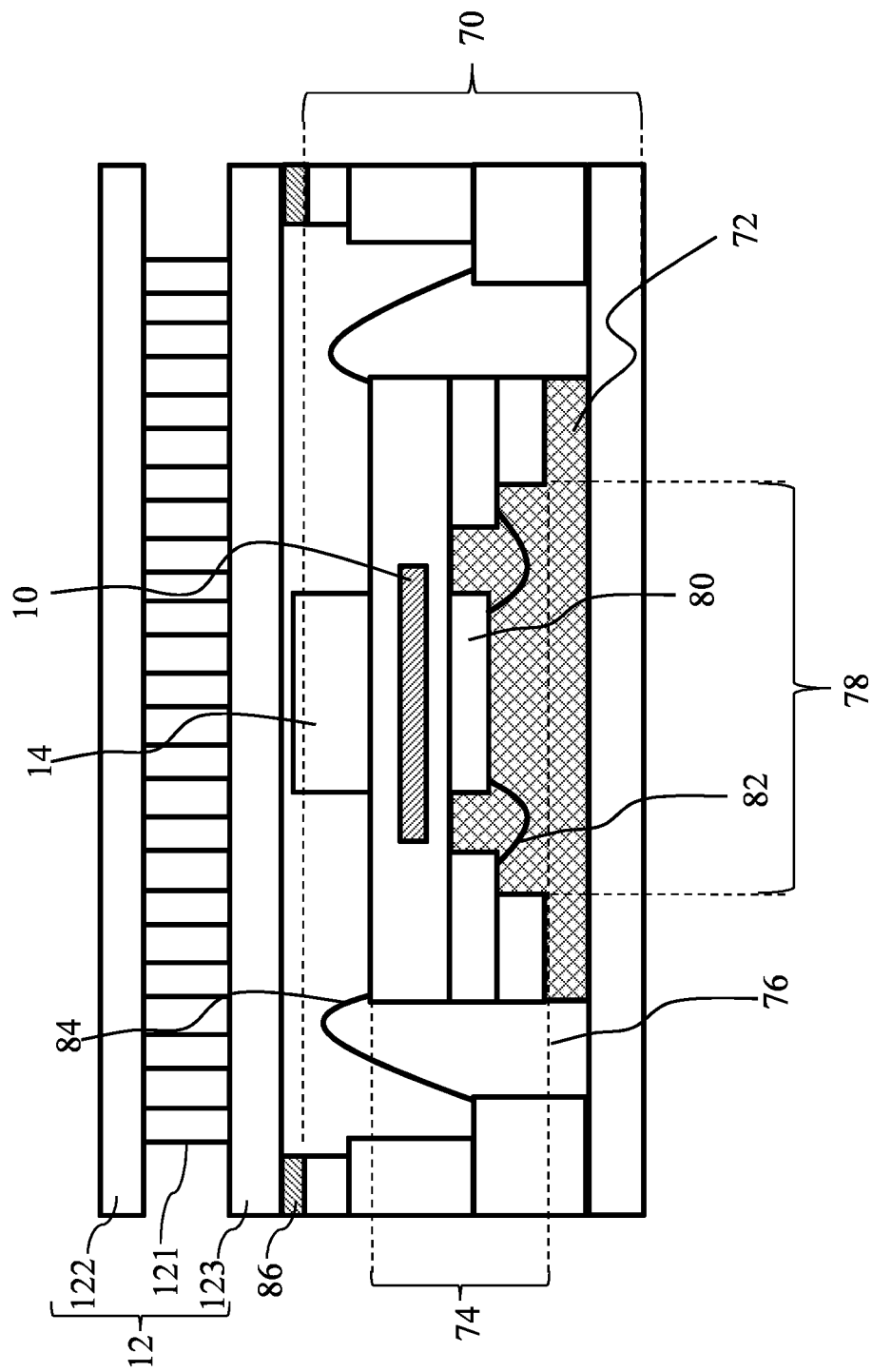
FIG. 15 is a cross-sectional view of an oscillating device according to a fourteenth embodiment of the invention.

FIG. 15 is a cross-sectional view of an oscillating device according to a fourteenth embodiment of the invention. Referring to FIG. 15 and FIG. 1, the fourteenth embodiment is introduced as follows. Compared with the first embodiment, the fourteenth embodiment of the oscillating device further includes an outer wiring base 70, a heat-insulating adhesive 72, and an inner wiring base 74. The top of the outer wiring base 70 is provided a first cavity 76. The heat-insulating adhesive 72 is formed on the outer wiring base 70 and in the first cavity 76. The bottom of the inner wiring base 74 is provided with a second cavity 78. The temperature controlled circuit 16 and the voltage controlled oscillation circuit 18 are integrated in an integrated circuit (IC) 80. The IC 80 is formed on the inner wiring base 74 and in the second cavity 78 and electrically connected to the inner wiring base 74 through first conductive wires 82. The first conductive wires 82 are formed in the second cavity 78. The inner wiring base 74 is formed on the outer wiring base 70 through the heat-insulating adhesive 72. The second cavity 78 is filled with the heat-insulating adhesive 72 that covers the IC 80 and the first conductive wires 82. The heater 10 is embedded in the inner wiring base 74. The frequency source 14 is formed on the inner wiring base 74. The inner wiring base 74 is electrically connected to the outer wiring base 70 through second conductive wires 84. In an embodiment, the thermoelectric cooler 12 may include a wiring heat-conducting plate 123, thermoelectric components 121, and a heat-conducting plate 122. The wiring heat-conducting plate 123, formed on the outer wiring base 70, covers the first cavity 76. The wiring heat-conducting plate 123 is electrically connected to the outer wiring base 70 through conductive pads 86. The thermoelectric components 121 are formed on the wiring heat-conducting plate 123. The heat-conducting plate 122 is formed on the thermoelectric components 121.

Figure 16:
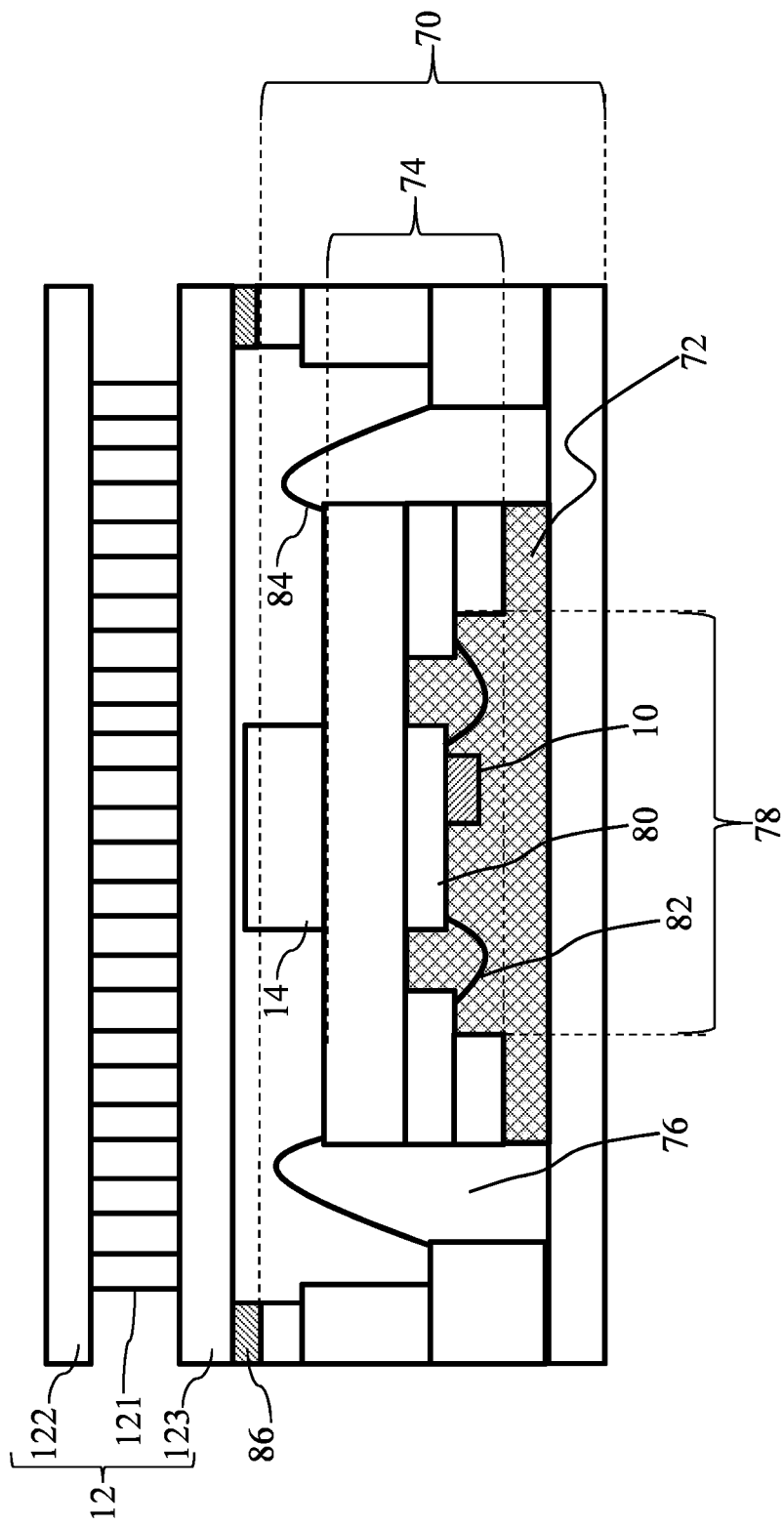
FIG. 16 is a cross-sectional view of an oscillating device according to a fifteenth embodiment of the invention.

FIG. 16 is a cross-sectional view of an oscillating device according to a fifteenth embodiment of the invention. Referring to FIG. 16, the fifteenth embodiment is introduced as follows. The fifteenth embodiment is different from the fourteenth embodiment in the location of the heater 10. In the fifteenth embodiment, the heater 10 is formed between the heat-insulating adhesive 72 and the IC 80. The other structures have been described previously in the fourteenth embodiment so will not be reiterated.

Figure 17:
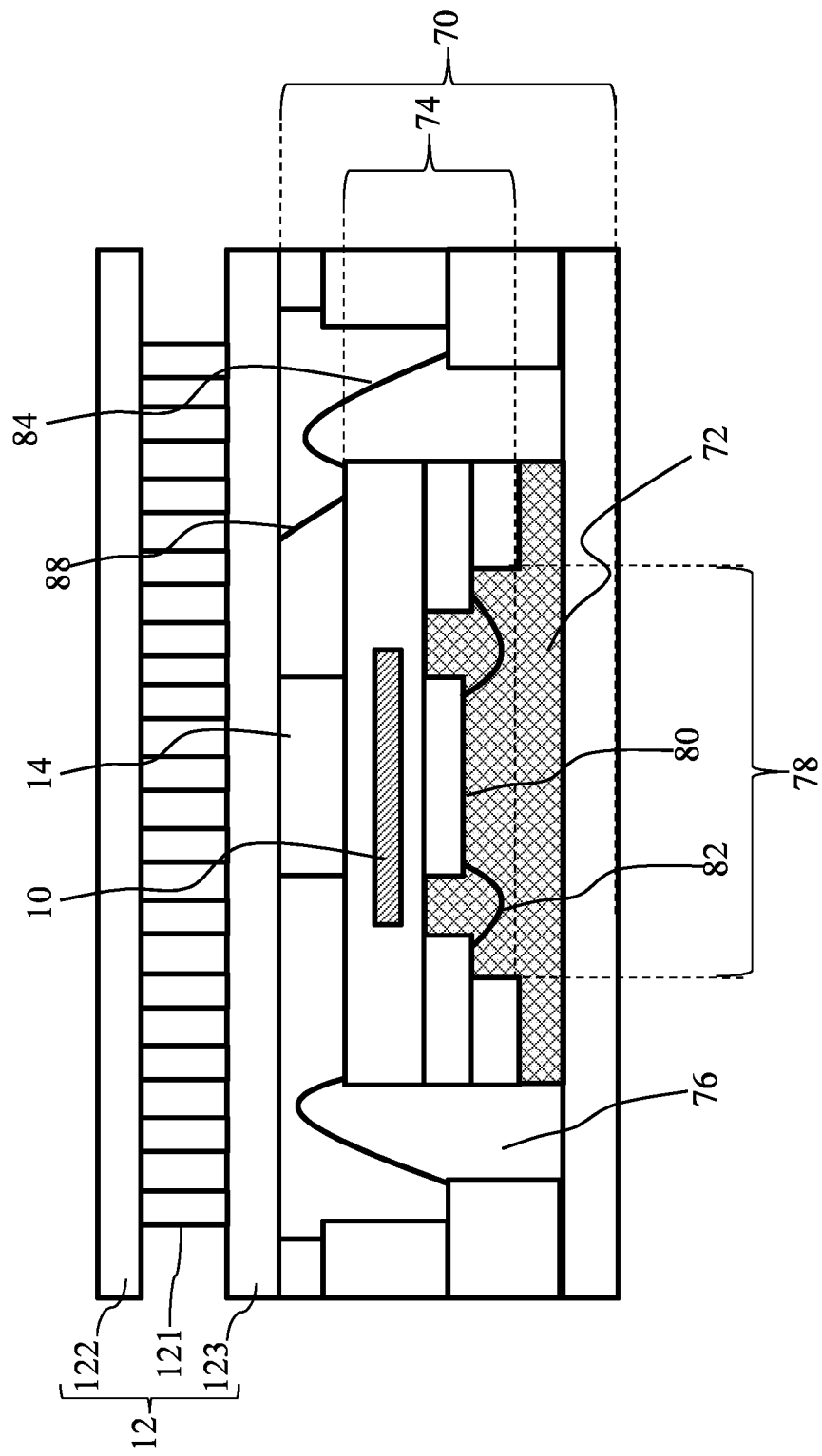
FIG. 17 is a cross-sectional view of an oscillating device according to a sixteenth embodiment of the invention.

FIG. 17 is a cross-sectional view of an oscillating device according to a sixteenth embodiment of the invention. Referring to FIG. 17, the sixteenth embodiment is introduced as follows. The sixteenth embodiment is different from the fourteenth embodiment in the manner that the wiring heat-conducting plate 123 is electrically connected. In the sixteenth embodiment, the wiring heat-conducting plate 123 is electrically connected to the inner wiring base 74 through third conductive wires 88 rather than connected to the outer wiring base 70. The other structures have been described previously in the fourteenth embodiment so will not be reiterated.

Figure 18:
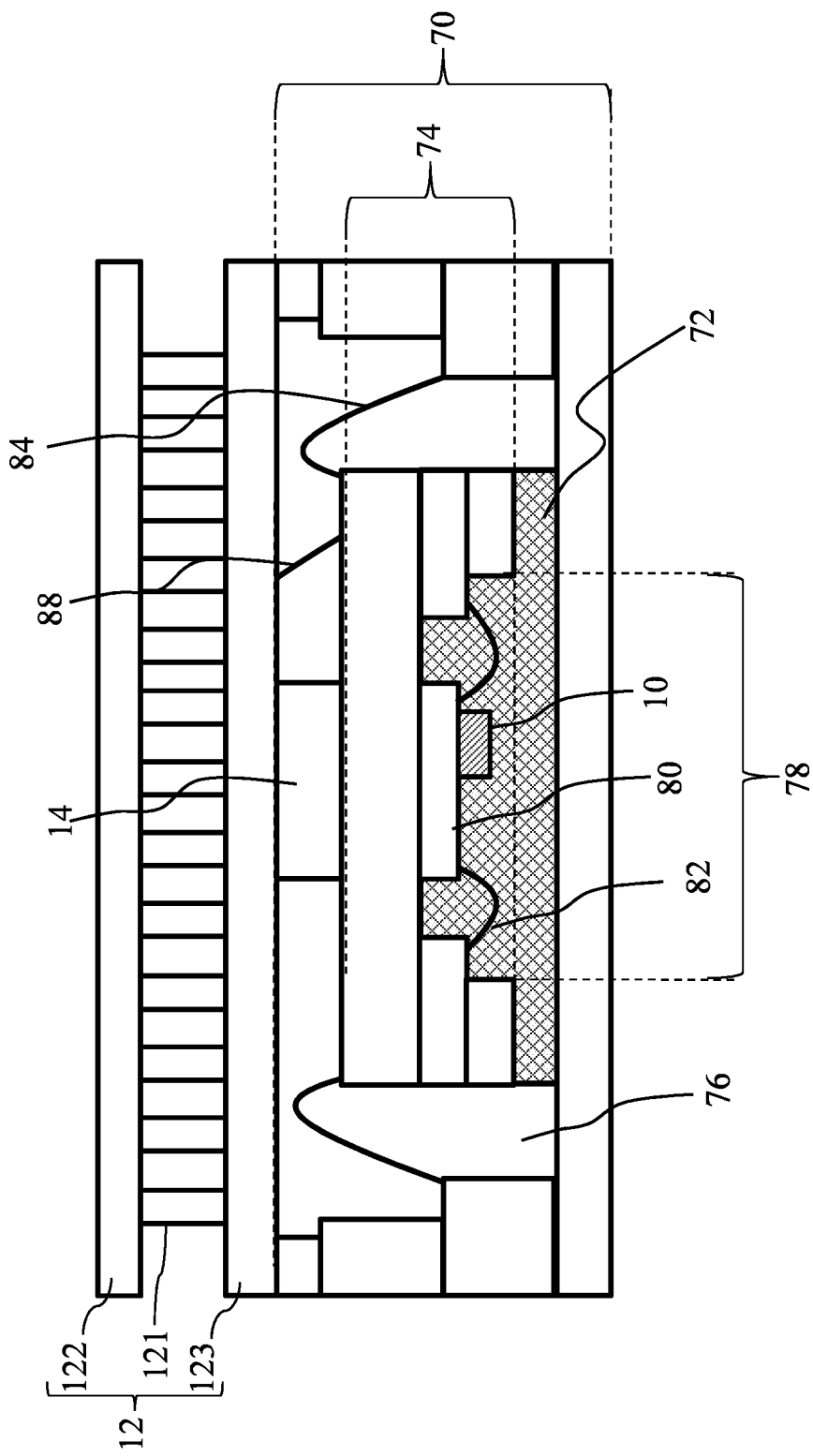
FIG. 18 is a cross-sectional view of an oscillating device according to a seventeenth embodiment of the invention.

FIG. 18 is a cross-sectional view of an oscillating device according to a seventeenth embodiment of the invention. Referring to FIG. 18, the seventeenth embodiment is introduced as follows. The seventeenth embodiment is different from the sixteenth embodiment in the location of the heater 10. In the seventeenth embodiment, the heater 10 is formed between the heat-insulating adhesive 72 and the IC 80. The other structures have been described previously in the sixteenth embodiment so will not be reiterated.

Figure 19:
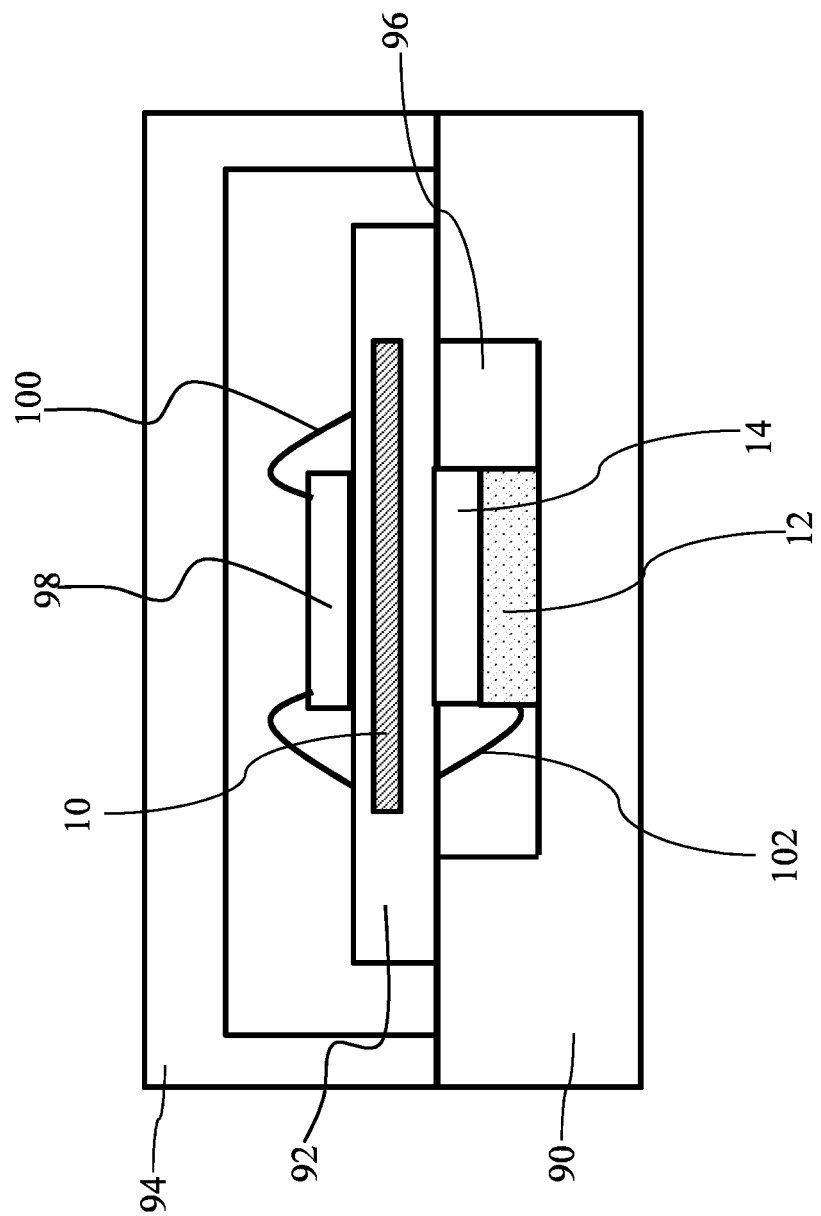
FIG. 19 is a cross-sectional view of an oscillating device according to an eighteenth embodiment of the invention.

FIG. 19 is a cross-sectional view of an oscillating device according to an eighteenth embodiment of the invention. Referring to FIG. 19 and FIG. 1, the eighteenth embodiment is introduced as follows. Compared with the first embodiment, the eighteenth embodiment of the oscillating device further includes a base 90, a wiring substrate 92, and a cover 94. The top of the base 90 is provided with a cavity 96. The wiring substrate 92, formed on the base 90, covers the cavity 96. The temperature controlled circuit 16 and the voltage controlled oscillation circuit 18 are integrated in an integrated circuit (IC) 98. The IC 98 is formed on the top of the wiring substrate 92 and electrically connected to the wiring substrate 92 through first conductive wires 100. The heater 10 is embedded in the wiring substrate 92. The frequency source 14 is formed on the bottom of the wiring substrate 92 and in the cavity 96. The thermoelectric cooler 12 is formed on the frequency source 14 and in the cavity 96 and electrically connected to the wiring substrate 92 through second conductive wire 102. The cover 94, formed on the base 90, covers the wiring substrate 92, the IC 98, and the first conductive wires 100.

Figure 20:
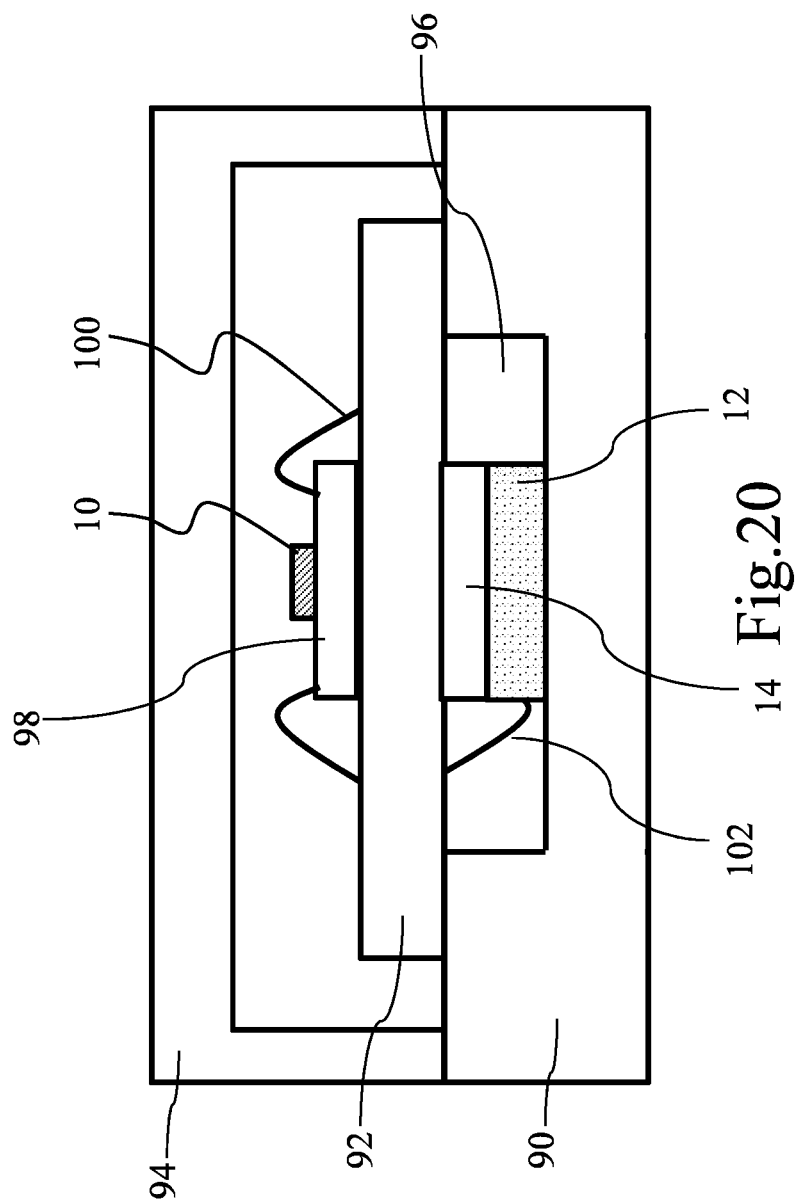
FIG. 20 is a cross-sectional view of an oscillating device according to a nineteenth embodiment of the invention.

FIG. 20 is a cross-sectional view of an oscillating device according to a nineteenth embodiment of the invention. Referring to FIG. 20, the nineteenth embodiment is introduced as follows. The nineteenth embodiment is different from the eighteenth embodiment in the location of the heater 10. In the nineteenth embodiment, the heater 10 is formed on the IC 28 and covered with the cover 94. The other structures have been described previously in the eighteenth embodiment so will not be reiterated.

Figure 21:
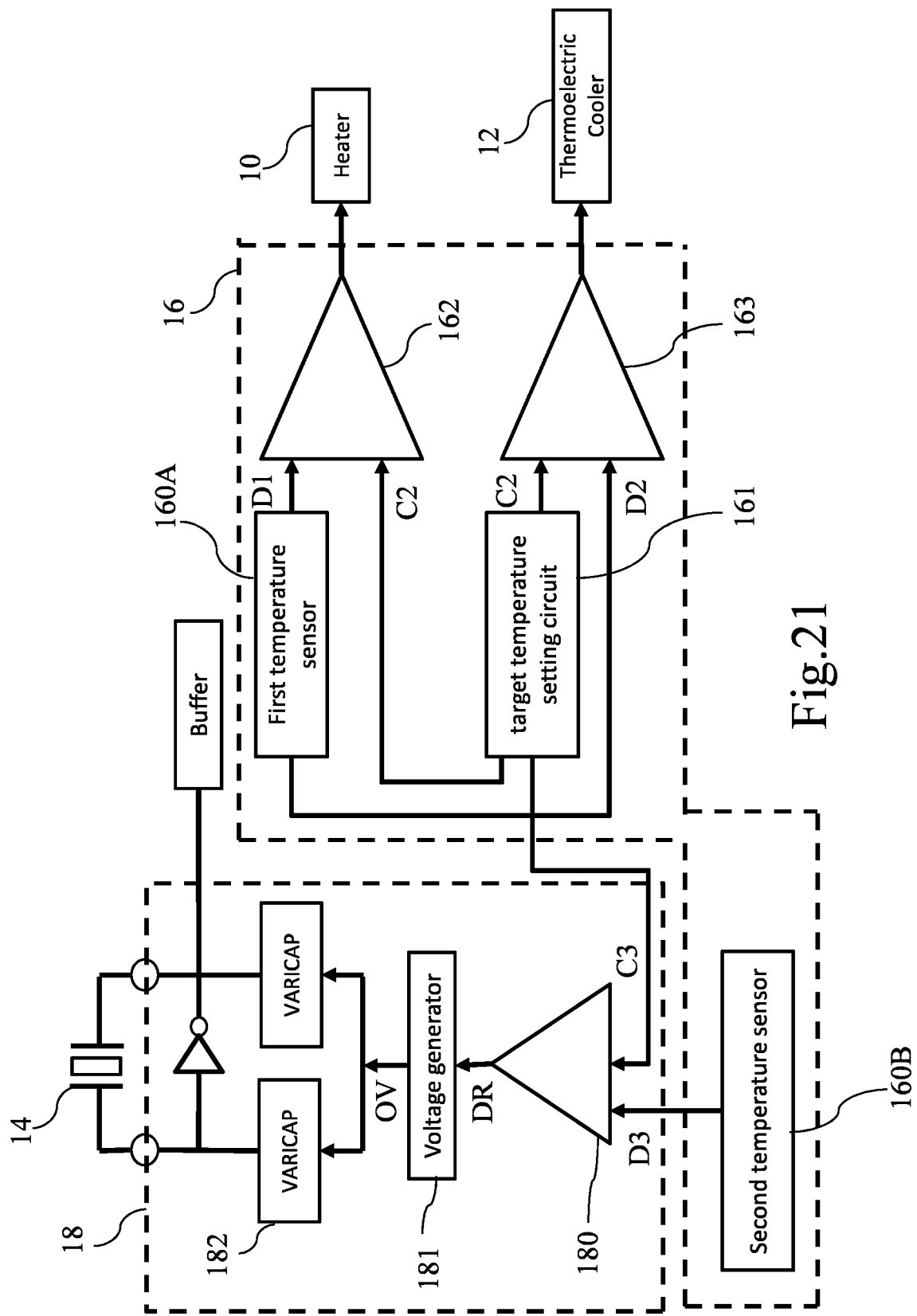
FIG. 21 is a diagram schematically illustrating an oscillating device according to a twentieth embodiment of the invention.

FIG. 21 is a diagram schematically illustrating an oscillating device according to a twentieth embodiment of the invention. Referring to FIG. 21 and FIG. 1, the twentieth embodiment is introduced as follows. Compared with the first embodiment, the twentieth embodiment of the oscillating device uses two temperature sensors that include a first temperature sensor 160A and a second temperature sensor 160B in the temperature controlled circuit 16. The first temperature sensor 160A is electrically connected to the first comparator 162 and the second comparator 163.

The second temperature sensor 160B is electrically connected to the third comparator 180 of the voltage controlled oscillation circuit 18. The first temperature sensor 160A senses the ambient temperature to generate the first detected voltage D1 when the ambient temperature is in the first range. The first temperature sensor 160A senses the ambient temperature to generate the second detected voltage D2 when the ambient temperature is in the second range. The second temperature sensor 160B senses the ambient temperature to generate the third detected voltage D3 when the ambient temperature is in the second range. The other technical features have been described previously in the first embodiment so will not be reiterated.

Figure 22:
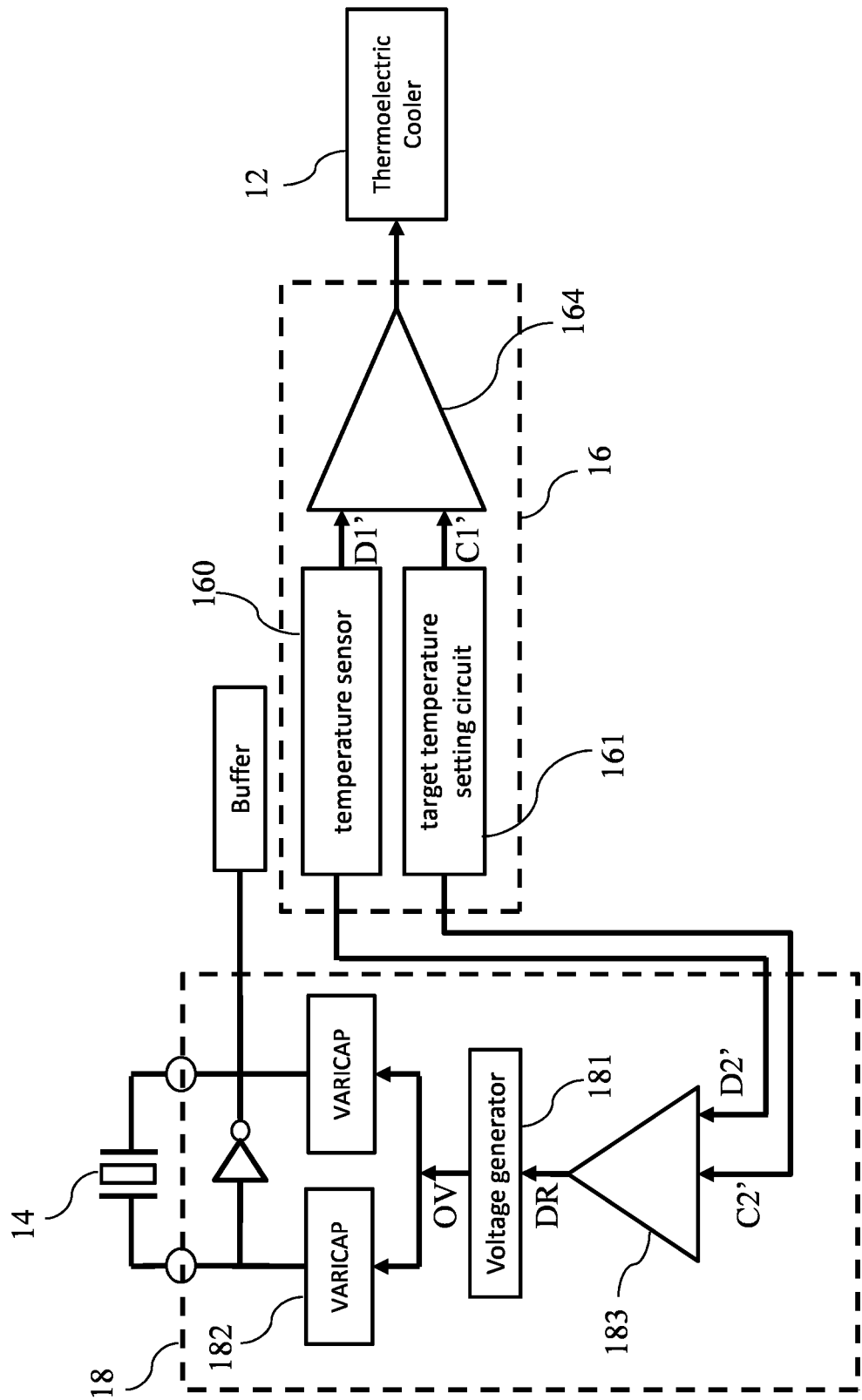
FIG. 22 is a diagram schematically illustrating an oscillating device according to a twenty-first embodiment of the invention.

FIG. 22 is a diagram schematically illustrating an oscillating device according to a twenty-first embodiment of the invention. Referring to FIG. 22 and FIG. 1, the twenty-first embodiment is introduced as follows. The oscillating device of the twenty-first embodiment, arranged in an environment having an ambient temperature, includes a thermoelectric cooler 12, a frequency source 14, a voltage controlled oscillation circuit 18, and a temperature controlled circuit 16. Compared with the first embodiment, the twenty-first embodiment omits the heater 10. The other technical features have been described previously in the first embodiment so will not be reiterated. The embodiments of the foregoing cross-sectional views are also applied to the twenty-first embodiment in a suitable manner.

In some embodiments, the temperature controlled circuit 16 may include at least one temperature sensor 160, a target temperature setting circuit 161, and a first comparator 164. The temperature sensor 160 is electrically connected to the voltage controlled oscillation circuit 18. The target temperature setting circuit 161 is electrically connected to the voltage controlled oscillation circuit 18. The first comparator 164 is electrically connected to the temperature sensor 160, the target temperature setting circuit 161, and the thermoelectric cooler 12.

The temperature sensor 160 senses the ambient temperature to generate a first detected voltage D1' when the ambient temperature is in the second range. The temperature sensor 160 senses the ambient temperature to generate a second detected voltage D2' when the ambient temperature is in the first range. The target temperature setting circuit 161 generates a first control voltage C1' based on the ambient temperature and the target temperature when the ambient temperature is in the second range. The target temperature setting circuit 161 generates a second control voltage C2' based on the ambient temperature and the target temperature when the ambient temperature is in the first range. The first comparator 164 receives the first control voltage C1' and the first detected voltage D1' and drives the thermoelectric cooler 12 based on the first control voltage C1' and the first detected voltage D1'. The voltage controlled oscillation circuit 18 receives the second detected voltage D2' and the second control voltage C2' to drive the frequency source 14.

The voltage controlled oscillation circuit 18 may include a second comparator 183, a voltage generator 181, and at least one voltage controlled variable capacitor 182. The twenty-first embodiment exemplifies two voltage controlled variable capacitors 182. The second comparator 183 is electrically connected to the temperature sensor 160 and the target temperature setting circuit 161. The voltage generator 181 is electrically connected to the second comparator 183. The voltage controlled variable capacitors 182 are electrically connected to the frequency source 14 and the voltage generator 181. The second comparator 183 receives the second control voltage C2' and the second detected voltage D2' to generate a driving voltage DR. The voltage generator 181 receives the driving voltage DR and generates at least one operating voltage OV based on the driving voltage DR. The voltage controlled variable capacitors 182 receive the operating voltage OV to adjust capacitance, thereby reducing the frequency variation of the frequency source 14.

Figure 23:
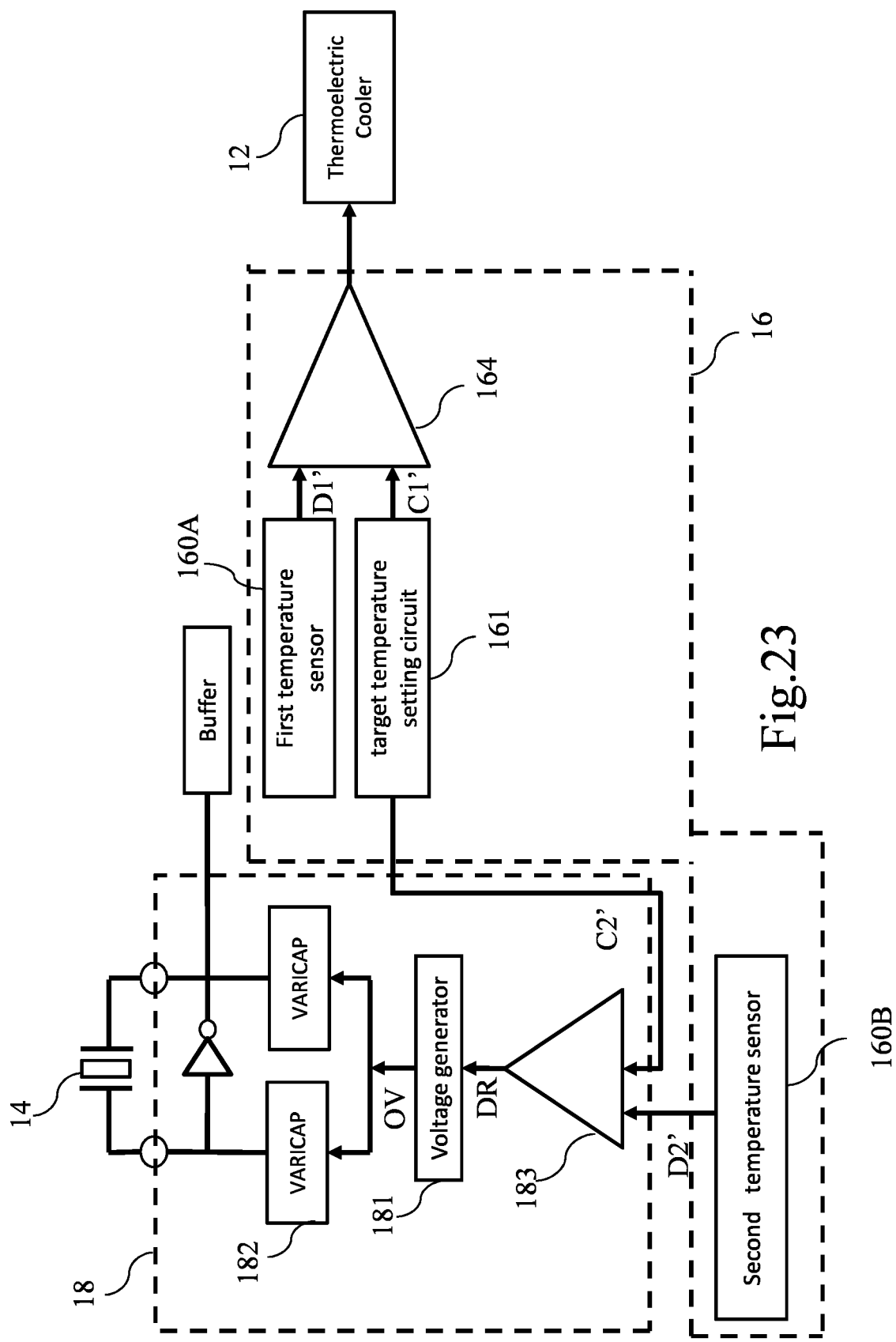
FIG. 23 is a diagram schematically illustrating an oscillating device according to a twenty-second embodiment of the invention.

FIG. 23 is a diagram schematically illustrating an oscillating device according to a twenty-second embodiment of the invention. Referring to FIG. 23 and FIG. 22, the twenty-second embodiment is introduced as follows. Compared with the twenty-first embodiment, the twenty-second embodiment of the oscillating device uses two temperature sensors that include a first temperature sensor 160A and a second temperature sensor 160B in the temperature controlled circuit 16. The first temperature sensor 160A is electrically connected to the first comparator 164. The second temperature sensor 160B is electrically connected to the second comparator 183 of the voltage controlled oscillation circuit 18. The first temperature sensor 160A senses the ambient temperature to generate the first detected voltage D1' when the ambient temperature is in the second range. The second temperature sensor 160B senses the ambient temperature to generate the second detected voltage D2' when the ambient temperature is in the first range. The other technical features have been described previously in the twenty-first embodiment so will not be reiterated.

Figure 24:
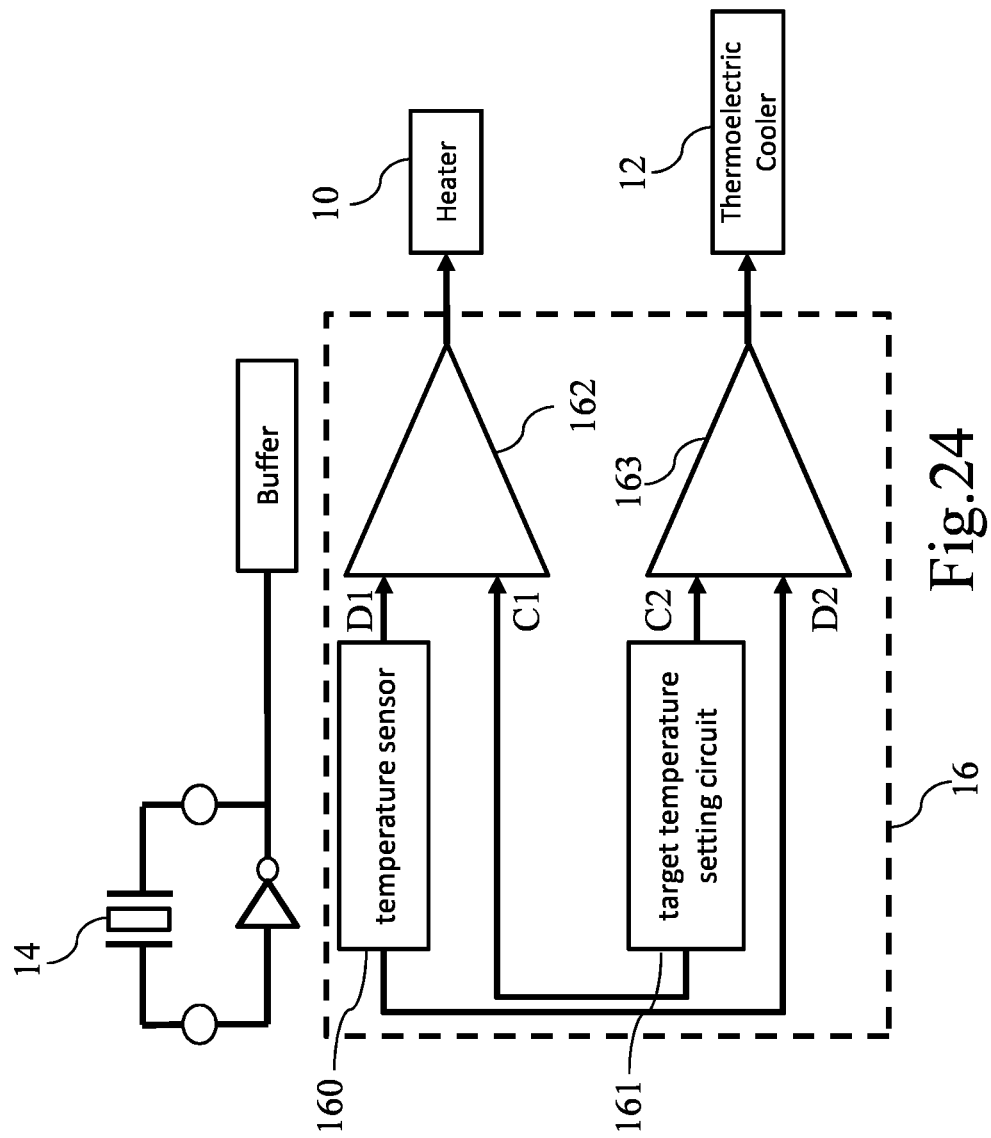
FIG. 24 is a diagram schematically illustrating an oscillating device according to a twenty-third embodiment of the invention.

FIG. 24 is a diagram schematically illustrating an oscillating device according to a twenty-third embodiment of the invention. Referring to FIG. 24 and FIG. 1, the twenty-third embodiment is introduced as follows. Compared with the first embodiment, the twenty-third embodiment omits the voltage controlled oscillation circuit 18. The other technical features have been described previously in the first embodiment so will not be reiterated.

According to the embodiments provided above, the oscillating device avoids degrading the performance of the IC due to too high a target temperature.

What is claimed is:

1. An oscillating device, arranged in an environment having an ambient temperature, comprising:
    a heater;
    a thermoelectric cooler;
    a frequency source whose frequency is temperature-dependent on the ambient temperature;
    a temperature controlled circuit electrically connected to the heater and the thermoelectric cooler, wherein, when the ambient temperature is in a first range between a first temperature and a second temperature higher than the first temperature, the temperature controlled circuit drives the heater to a target temperature to adjust an operating temperature of the frequency source, and when the ambient temperature is in a second range between a third temperature and a fourth temperature higher than the third temperature, the temperature controlled circuit drives the thermoelectric cooler to the target temperature to adjust the operating temperature of the frequency source; and
    a voltage controlled oscillation circuit electrically connected to the frequency source and the temperature controlled circuit, wherein, when the ambient temperature is in the second range, the voltage controlled oscillation circuit drives the frequency source to reduce a frequency variation of the frequency source resulted from a variation of the ambient temperature;
    wherein the third temperature is higher than the first temperature and the fourth temperature is higher than the second temperature;
    wherein the temperature controlled circuit is configured to generate a control voltage based on the ambient temperature and the target temperature and transmit the control voltage to the voltage controlled oscillation circuit to drive the frequency source;
    wherein the temperature controlled circuit comprises:
        at least one temperature sensor electrically connected to the voltage controlled oscillation circuit, wherein the at least one temperature sensor senses the ambient temperature to generate a first detected voltage when the ambient temperature is in the first range, and the at least one temperature sensor senses the ambient temperature to generate a second detected voltage and a third detected voltage when the ambient temperature is in the second range;
        a target temperature setting circuit electrically connected to the voltage controlled oscillation circuit, wherein the target temperature setting circuit generates a first control voltage based on the ambient temperature and the target temperature when the ambient temperature is in the first range, and the target temperature setting circuit generates a second control voltage and a third control voltage based on the ambient temperature and the target temperature when the ambient temperature is in the second range;
        a first comparator electrically connected to the at least one temperature sensor, the target temperature setting circuit, and the heater and configured to receive the first control voltage and the first detected voltage and drive the heater based on the first control voltage and the first detected voltage; and
        a second comparator electrically connected to the at least one temperature sensor, the target temperature setting circuit, and the thermoelectric cooler and configured to receive the second control voltage and the second detected voltage and drive the thermoelectric cooler based on the second control voltage and the second detected voltage;
        wherein the voltage controlled oscillation circuit is configured to receive the third detected voltage and the third control voltage to drive the frequency source.

2. The oscillating device according to claim 1, wherein the voltage controlled oscillation circuit comprises:
    a third comparator electrically connected to the at least one temperature sensor and the target temperature setting circuit and configured to receive the third control voltage and the third detected voltage to generate a driving voltage;
    a voltage generator electrically connected to the third comparator and configured to receive the driving voltage and generate at least one operating voltage based on the driving voltage; and
    at least one voltage controlled variable capacitor electrically connected to the frequency source and the voltage generator and configured to receive the at least one operating voltage to adjust capacitance, thereby reducing the frequency variation of the frequency source.

3. The oscillating device according to claim 1, further comprising:
    a base with a top thereof provided with a cavity;
    a wiring substrate, formed on the base, covering the cavity, wherein the temperature controlled circuit and the voltage controlled oscillation circuit are integrated in an integrated circuit (IC), the IC is formed on the wiring substrate and in the cavity and electrically connected to the wiring substrate through first conductive wires, the first conductive wires are formed in the cavity, the heater is embedded in the wiring substrate or formed on the IC, the frequency source is formed on the wiring substrate, and the thermoelectric cooler is formed on the frequency source and electrically connected to the wiring substrate through second conductive wire; and
    a cover, formed on the base, covering the wiring substrate, the frequency source, the thermoelectric cooler, and the second conductive wires.

4. The oscillating device according to claim 1, further comprising:
    a wiring substrate;
    a heat-insulating adhesive formed on the wiring substrate;
    a wiring base with a bottom thereof provided with a cavity, wherein the temperature controlled circuit and the voltage controlled oscillation circuit are integrated in an integrated circuit (IC), the IC is formed on the wiring base and in the cavity and electrically connected to the wiring base through first conductive wires, the first conductive wires are formed in the cavity, the wiring base is formed on the wiring substrate through the heat-insulating adhesive, the cavity is filled with the heat-insulating adhesive, the heat-insulating adhesive covers the IC and the first conductive wires, the heater is embedded in the wiring base or formed between the heat-insulating adhesive and the IC, the frequency source is formed on the wiring base, the thermoelectric cooler is formed on the frequency source and electrically connected to the wiring base through second conductive wire, and the wiring base is electrically connected to the wiring substrate through third conductive wires; and a cover, formed on the wiring substrate, covering the wiring base, the frequency source, the thermoelectric cooler, the heat-insulating adhesive, the second conductive wires, and the third conductive wires.

5. The oscillating device according to claim 1, further comprising:

a base with a top thereof provided with a cavity; and a wiring substrate, formed on the base, covering the cavity, wherein the temperature controlled circuit and the voltage controlled oscillation circuit are integrated in an integrated circuit (IC), the IC is formed on the wiring substrate and in the cavity and electrically connected to the wiring substrate through first conductive wires, the first conductive wires are formed in the cavity, the heater is embedded in the wiring substrate or formed on the IC, and the frequency source is formed on the wiring substrate;

the thermoelectric cooler comprises:

a wiring heat-conducting structure, formed on the base and electrically connected to the wiring substrate through second conductive wires, covering the wiring substrate, the frequency source, and the second conductive wires;

thermoelectric components formed on the wiring heat-conducting structure; and a heat-conducting plate formed on the thermoelectric components.

6. The oscillating device according to claim 1, further comprising:

a wiring substrate;

a heat-insulating adhesive formed on the wiring substrate; and a wiring base with a bottom thereof provided with a cavity, wherein the temperature controlled circuit and the voltage controlled oscillation circuit are integrated in an integrated circuit (IC), the IC is formed on the wiring base and in the cavity and electrically connected to the wiring base through first conductive wires, the first conductive wires are formed in the cavity, the wiring base is formed on the wiring substrate through the heat-insulating adhesive, the cavity is filled with the heat-insulating adhesive, the heat-insulating adhesive covers the IC and the first conductive wires, the heater is embedded in the wiring base or formed between the heat-insulating adhesive and the IC, and the frequency source is formed on the wiring base;

the thermoelectric cooler comprises:

a wiring heat-conducting structure formed on the wiring substrate and electrically connected to the wiring base through second conductive wires, wherein the wiring base is electrically connected to the wiring substrate through second conductive wires, and the wiring heat-conducting structure covers the wiring base, the frequency source, the heat-insulating adhesive, the second conductive wires, and the third conductive wires;

thermoelectric components formed on the wiring heat-conducting structure; and a heat-conducting plate formed on the thermoelectric components.

7. The oscillating device according to claim 1, further comprising:

a wiring base with a top thereof provided with a cavity;

a heat-insulating adhesive formed on the wiring base and in the cavity; and a wiring substrate formed on the heat-insulating adhesive and in the cavity, wherein the temperature controlled circuit and the voltage controlled oscillation circuit are integrated in an integrated circuit (IC), the IC is formed on a bottom of the wiring substrate and electrically connected to the wiring substrate through first conductive wires, the first conductive wires and the IC are covered with the heat-insulating adhesive, the heater is embedded in the wiring substrate or formed on the IC, the wiring substrate is electrically connected to the wiring base through second conductive wires, the frequency source is formed on the wiring substrate and in the cavity, and when the heater is formed on the IC, the heater is covered with the heat-insulating adhesive;

the thermoelectric cooler comprises:

a wiring heat-conducting plate, formed on the wiring base, covering the cavity, wherein the wiring heat-conducting plate is electrically connected to the wiring base through conductive pads or electrically connected to the wiring substrate through third conductive wires;

thermoelectric components formed on the wiring heat-conducting plate; and a heat-conducting plate formed on the thermoelectric components.

8. The oscillating device according to claim 1, further comprising:

an outer wiring base with a top provided a first cavity;

a heat-insulating adhesive formed on the outer wiring base and in the first cavity; and an inner wiring base with a bottom thereof provided with a second cavity, wherein the temperature controlled circuit and the voltage controlled oscillation circuit are integrated in an integrated circuit (IC), the IC is formed on the inner wiring base and in the second cavity and electrically connected to the inner wiring base through first conductive wires, the first conductive wires are formed in the second cavity, the inner wiring base is formed on the outer wiring base through the heat-insulating adhesive, the second cavity is filled with the heat-insulating adhesive that covers the IC and the first conductive wires, the heater is embedded in the inner wiring base or formed between the heat-insulating adhesive and the IC, the frequency source is formed on the inner wiring base, and the inner wiring base is electrically connected to the outer wiring base through second conductive wires;

the thermoelectric cooler comprises:

a wiring heat-conducting plate, formed on the outer wiring base, covering the first cavity, wherein the wiring heat-conducting plate is electrically connected to the outer wiring base through conductive pads or electrically connected to the inner wiring base through third conductive wires;

thermoelectric components formed on the wiring heat-conducting plate; and a heat-conducting plate formed on the thermoelectric components.

9. The oscillating device according to claim 1, wherein the at least one temperature sensor comprises a first temperature sensor and a second temperature sensor, the first temperature sensor is electrically connected to the first comparator and the second comparator, the second temperature sensor is electrically connected to the voltage controlled oscillation circuit, the first temperature sensor senses the ambient temperature to generate the first detected voltage when the ambient temperature is in the first range, the first temperature sensor senses the ambient temperature to generate the second detected voltage when the ambient temperature is in the second range, and the second temperature sensor senses the ambient temperature to generate the third detected voltage when the ambient temperature is in the second range.

10. The oscillating device according to claim 1, wherein the target temperature has a correlation of a first-order polynomial, a high-order polynomial, or a set of a first-order and high-order polynomial combination to the ambient temperature.

11. An oscillating device, arranged in an environment having an ambient temperature, comprising:
  a thermoelectric cooler;
  a frequency source whose frequency is temperature-dependent on the ambient temperature;
  a voltage controlled oscillation circuit electrically connected to the frequency source, wherein, when the ambient temperature is in a first range between a first temperature and a second temperature higher than the first temperature, the voltage controlled oscillation circuit drives the frequency source to reduce a frequency variation of the frequency source resulted from a variation of the ambient temperature; and
  a temperature controlled circuit electrically connected to the thermoelectric cooler, wherein, when the ambient temperature is in a second range between a third temperature and a fourth temperature higher than the third temperature, the temperature controlled circuit drives the thermoelectric cooler to a target temperature to adjust an operating temperature of the frequency source;
  wherein the third temperature is higher than the first temperature and the fourth temperature is higher than the second temperature;
  wherein the temperature controlled circuit is configured to generate a control voltage based on the ambient temperature and the target temperature and transmit the control voltage to the voltage controlled oscillation circuit to drive the frequency source . , wherein the temperature controlled circuit comprises:
    at least one temperature sensor electrically connected to the voltage controlled oscillation circuit, wherein the at least one temperature sensor senses the ambient temperature to generate a first detected voltage when the ambient temperature is in the second range, and the at least one temperature sensor senses the ambient temperature to generate a second detected voltage when the ambient temperature is in the first range;
    a target temperature setting circuit electrically connected to the voltage controlled oscillation circuit, wherein the target temperature setting circuit generates a first control voltage based on the ambient temperature and the target temperature when the ambient temperature is in the second range, and the target temperature setting circuit generates a second control voltage based on the ambient temperature and the target temperature when the ambient temperature is in the first range; and
    a first comparator electrically connected to the at least one temperature sensor, the target temperature setting circuit, and the thermoelectric cooler and configured to receive the first control voltage and the first detected voltage and drive the thermoelectric cooler based on the first control voltage and the first detected voltage;
  wherein the voltage controlled oscillation circuit is configured to receive the second detected voltage and the second control voltage to drive the frequency source.

12. The oscillating device according to claim 11, wherein the voltage controlled oscillation circuit comprises:
  a second comparator electrically connected to the at least one temperature sensor and the target temperature setting circuit and configured to receive the second control voltage and the second detected voltage to generate a driving voltage;
  a voltage generator electrically connected to the second comparator and configured to receive the driving voltage and generate at least one operating voltage based on the driving voltage; and
  at least one voltage controlled variable capacitor electrically connected to the frequency source and the voltage generator and configured to receive the at least one operating voltage to adjust capacitance, thereby reducing the frequency variation of the frequency source.

13. The oscillating device according to claim 11, wherein the at least one temperature sensor comprises a first temperature sensor and a second temperature sensor, the first temperature sensor is electrically connected to the first comparator, the second temperature sensor is electrically connected to the voltage controlled oscillation circuit, the first temperature sensor senses the ambient temperature to generate the first detected voltage when the ambient temperature is in the second range, and the second temperature sensor senses the ambient temperature to generate the second detected voltage when the ambient temperature is in the first range.

14. The oscillating device according to claim 11, wherein the target temperature has a correlation of a first-order polynomial, a high-order polynomial, or a set of a first-order and high-order polynomial combination to the ambient temperature.

15. An oscillating device, arranged in an environment having an ambient temperature, comprising:
  a heater;
  a thermoelectric cooler;
  a frequency source whose frequency is temperature-dependent on the ambient temperature; and
  a temperature controlled circuit electrically connected to the heater and the thermoelectric cooler, wherein, when the ambient temperature is in a first range between a first temperature and a second temperature higher than the first temperature, the temperature controlled circuit drives the heater to a target temperature to adjust an operating temperature of the frequency source, and when the ambient temperature is in a second range between a third temperature and a fourth temperature higher than the third temperature, the temperature controlled circuit drives the thermoelectric cooler to the target temperature to adjust the operating temperature of the frequency source;
  wherein the third temperature is higher than the first temperature and the fourth temperature is higher than the second temperature:
  wherein the temperature controlled circuit comprises:

a temperature sensor sensing the ambient temperature to generate a first detected voltage when the ambient temperature is in the first range, and the temperature sensor senses the ambient temperature to generate a second detected voltage when the ambient temperature is in the second range;

a target temperature setting circuit generating a first control voltage based on the ambient temperature and the target temperature when the ambient temperature is in the first range, and the target temperature setting circuit generates a second control voltage based on the ambient temperature and the target temperature when the ambient temperature is in the second range;

a first comparator electrically connected to the temperature sensor, the target temperature setting circuit, and the heater and configured to receive the first control voltage and the first detected voltage and drive the heater based on the first control voltage and the first detected voltage; and a second comparator electrically connected to the temperature sensor, the target temperature setting circuit, and the thermoelectric cooler and configured to receive the second control voltage and the second detected voltage and drive the thermoelectric cooler based on the second control voltage and the second detected voltage.

16. The oscillating device according to claim 15, wherein the target temperature has a correlation of a first-order polynomial, a high-order polynomial, or a set of a first-order and high-order polynomial combination to the ambient temperature.

\* \* \* \* \*